United States Patent
Zheng et al.

(10) Patent No.: US 12,223,893 B2
(45) Date of Patent: Feb. 11, 2025

(54) DISPLAY SUBSTRATE AND PREPARATION METHOD THEREOF, AND DISPLAY APPARATUS

(71) Applicant: BOE Technology Group Co., Ltd., Beijing (CN)

(72) Inventors: Can Zheng, Beijing (CN); Li Wang, Beijing (CN); Long Han, Beijing (CN); Jianchao Zhu, Beijing (CN); Libin Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 429 days.

(21) Appl. No.: 17/764,993

(22) PCT Filed: May 28, 2021

(86) PCT No.: PCT/CN2021/096915
§ 371 (c)(1),
(2) Date: Mar. 30, 2022

(87) PCT Pub. No.: WO2022/160535
PCT Pub. Date: Aug. 4, 2022

(65) Prior Publication Data
US 2023/0200129 A1 Jun. 22, 2023

(30) Foreign Application Priority Data
Jan. 27, 2021 (WO) ............. PCT/CN2021/073957

(51) Int. Cl.
*G09G 3/32* (2016.01)
*G09G 3/3233* (2016.01)
(Continued)

(52) U.S. Cl.
CPC ....... *G09G 3/3233* (2013.01); *H10K 59/1201* (2023.02); *H10K 59/1213* (2023.02);
(Continued)

(58) Field of Classification Search
None
See application file for complete search history.

(56) References Cited

U.S. PATENT DOCUMENTS

2009/0009441 A1 1/2009 Yamamoto et al.
2009/0225013 A1 9/2009 Lee et al.
(Continued)

FOREIGN PATENT DOCUMENTS

| CN | 1700289 A | 11/2005 |
|---|---|---|
| CN | 103413812 A | 11/2013 |

(Continued)

OTHER PUBLICATIONS

Notice of Allowance for U.S. Appl. No. 17/626,474 Mailed Mar. 28, 2023.
(Continued)

*Primary Examiner* — Kretelia Graham
*Assistant Examiner* — Bilkis Jahan
(74) *Attorney, Agent, or Firm* — Ling Wu; Stephen Yang; Ling and Yang Intellectual Property

(57) ABSTRACT

Disclosed are a display substrate and a preparation method thereof, and a display apparatus. The display substrate includes a substrate and a plurality of sub-pixels, at least one sub-pixel includes a pixel drive circuit and a light emitting device connected to the pixel drive circuit, the pixel drive circuit includes a plurality of transistors, wherein at least one transistor includes an active layer and two gate electrodes. The substrate is provided with a semiconductor layer and a plurality of conductive layers disposed on one side of the semiconductor layer away from the substrate, at least one conductive layer is provided with at least one electrode plate, and there is an overlapping region between an orthographic projection of the electrode plate on the substrate and
(Continued)

an orthographic projection of the active layer between the two gate electrodes on the substrate.

20 Claims, 11 Drawing Sheets

(51) Int. Cl.
    *H10K 59/12* (2023.01)
    *H10K 59/121* (2023.01)
    *H10K 59/131* (2023.01)
    *H10K 59/35* (2023.01)
    *H10K 71/00* (2023.01)

(52) U.S. Cl.
    CPC ....... *H10K 59/1216* (2023.02); *H10K 59/131* (2023.02); *H10K 59/353* (2023.02); *H10K 71/00* (2023.02); *G09G 2300/0426* (2013.01); *G09G 2300/043* (2013.01); *G09G 2300/0819* (2013.01); *G09G 2300/0852* (2013.01); *G09G 2300/0861* (2013.01); *G09G 2310/0297* (2013.01); *G09G 2310/08* (2013.01); *G09G 2320/0242* (2013.01); *G09G 2320/0257* (2013.01); *G09G 2320/045* (2013.01); *G09G 2330/021* (2013.01)

(56) References Cited

U.S. PATENT DOCUMENTS

| | | |
|---|---|---|
| 2010/0220038 A1 | 9/2010 | Chung et al. |
| 2012/0026143 A1 | 2/2012 | Jang |
| 2013/0057532 A1 | 3/2013 | Lee et al. |
| 2014/0118229 A1 | 5/2014 | Han |
| 2014/0333686 A1 | 11/2014 | Kim et al. |
| 2015/0144902 A1* | 5/2015 | Do .................. H10K 50/805 257/40 |
| 2015/0279859 A1 | 10/2015 | Chen et al. |
| 2015/0348464 A1 | 12/2015 | In et al. |
| 2016/0035760 A1 | 2/2016 | Ning et al. |
| 2016/0079325 A1* | 3/2016 | Lee .................. H10K 71/00 438/26 |
| 2016/0079334 A1* | 3/2016 | Lee .................. H10K 59/122 438/34 |
| 2016/0117983 A1 | 4/2016 | Li et al. |
| 2016/0233247 A1 | 8/2016 | Bai et al. |
| 2016/0247821 A1 | 8/2016 | Li et al. |
| 2016/0351638 A1* | 12/2016 | Im .................. H10K 59/80522 |
| 2017/0005150 A1* | 1/2017 | Yeo .................. H10K 71/00 |
| 2017/0047002 A1 | 2/2017 | Xuan et al. |
| 2017/0249898 A1 | 8/2017 | Ma |
| 2017/0270860 A1 | 9/2017 | Wang et al. |
| 2018/0323244 A1* | 11/2018 | Im .................. H10K 59/122 |
| 2019/0251904 A1 | 8/2019 | Kim et al. |
| 2019/0259785 A1 | 8/2019 | Lee et al. |
| 2019/0295470 A1 | 9/2019 | Kim et al. |
| 2020/0027402 A1 | 1/2020 | Xiao et al. |
| 2020/0027939 A1 | 1/2020 | Cho et al. |
| 2020/0105793 A1 | 4/2020 | Ding et al. |
| 2020/0105801 A1 | 4/2020 | Zhou et al. |
| 2020/0161402 A1 | 5/2020 | Wang et al. |
| 2020/0193903 A1 | 6/2020 | Park et al. |
| 2020/0234648 A1 | 7/2020 | Zhu et al. |
| 2020/0302869 A1 | 9/2020 | Park et al. |
| 2020/0381524 A1 | 12/2020 | Xu et al. |
| 2021/0134917 A1 | 5/2021 | Li et al. |
| 2021/0167155 A1 | 6/2021 | Xu et al. |
| 2022/0004304 A1 | 1/2022 | Yang et al. |
| 2022/0068212 A1 | 3/2022 | Yao et al. |

FOREIGN PATENT DOCUMENTS

| | | |
|---|---|---|
| CN | 103489826 A | 1/2014 |
| CN | 103928472 A | 7/2014 |
| CN | 103971640 A | 8/2014 |
| CN | 104464616 A | 3/2015 |
| CN | 104576659 A | 4/2015 |
| CN | 105185305 A | 12/2015 |
| CN | 105185306 A | 12/2015 |
| CN | 205920745 U | 2/2017 |
| CN | 107316613 A | 11/2017 |
| CN | 108550553 A | 9/2018 |
| CN | 108630141 A | 10/2018 |
| CN | 108665852 A | 10/2018 |
| CN | 108695394 A | 10/2018 |
| CN | 108767016 A | 11/2018 |
| CN | 108806587 A | 11/2018 |
| CN | 109064972 A | 12/2018 |
| CN | 109300995 A | 2/2019 |
| CN | 109360828 A | 2/2019 |
| CN | 109979377 A | 7/2019 |
| CN | 110164378 A | 8/2019 |
| CN | 110491881 A | 11/2019 |
| CN | 110520832 A | 11/2019 |
| CN | 110729324 A | 1/2020 |
| CN | 110767539 A | 2/2020 |
| CN | 111613177 A | 9/2020 |
| CN | 111627387 A | 9/2020 |
| CN | 111696486 A | 9/2020 |
| CN | 211480028 U | 9/2020 |
| CN | 111739908 A | 10/2020 |
| CN | 111816691 A | 10/2020 |
| CN | 112037713 A | 12/2020 |
| IN | 109192143 A | 1/2019 |
| KR | 10-2020-0073419 A | 6/2020 |

OTHER PUBLICATIONS

International Search Report for PCT/CN2021/096915 Mailed Nov. 2, 2021.

International Search Report for PCT/CN2021/073957 Mailed Nov. 3, 2021.

Office Action dated Oct. 21, 2024 for Chinese Patent Application No. 202180000081.3 and English Translation.

* cited by examiner

DISPLAY SUBSTRATE AND PREPARATION METHOD THEREOF, AND DISPLAY APPARATUS

CROSS-REFERENCE TO RELATED APPLICATIONS

The present application is a U.S. National Phase Entry of International Application No. PCT/CN2021/096915 having an international filing date of May 28, 2021, which claims priority to PCT Application No. PCT/CN2021/073957, filed on Jan. 27, 2021 and entitled "Pixel Drive Circuit and Driving Method thereof, Display Substrate, and Display Apparatus". The above-identified applications are hereby incorporated by reference.

TECHNICAL FIELD

The present disclosure relates to the field of display technologies, and particularly relates to a display substrate and a preparation method thereof, and a display apparatus.

BACKGROUND

An Organic Light Emitting Diode (OLED) is an active light emitting display device, which has advantages such as self-luminescence, wide angle of view, high contrast ratio, low power consumption, extremely high response speed, lightness and thinness, flexibility, and low cost. With continuous development of display technologies, a flexible display apparatus with an OLED as a light emitting device and a Thin Film Transistor (TFT) for signal control has become a mainstream product in the display field.

SUMMARY

The following is a summary for subject matters described herein in detail. The summary is not intended to limit the scope of protection of claims.

The present application provides a display substrate. The display substrate includes a substrate and a plurality of sub-pixels, at least one sub-pixel includes a pixel drive circuit and a light emitting device connected to the pixel drive circuit, the pixel drive circuit includes a plurality of transistors, wherein at least one transistor includes an active layer and two gate electrodes. The substrate is provided with a semiconductor layer and a plurality of conductive layers disposed on one side of the semiconductor layer away from the substrate, at least one conductive layer is provided with at least one electrode plate, and there is an overlapping region between an orthographic projection of the electrode plate on the substrate and an orthographic projection of the active layer between the two gate electrodes on the substrate.

In an exemplary embodiment, the plurality of conductive layers includes a first conductive layer, a second conductive layer, and a third conductive layer disposed sequentially on one side of the semiconductor layer away from the substrate, and the electrode plate is disposed on the first conductive layer, the second conductive layer, or the third conductive layer.

In an exemplary embodiment, the display substrate further includes a first power supply line connected to the pixel drive circuit, and at least one electrode plate is connected to the first power supply line.

In an exemplary embodiment, the plurality of transistors at least include a first transistor, a second transistor, a third transistor, a fourth transistor, and a fifth transistor; a first electrode of the first transistor is connected to a data signal line, and a second electrode of the first transistor is connected to a third node; a first electrode of the second transistor is connected to a first node, and a second electrode of the second transistor is connected to a fourth node; a gate electrode of the third transistor is connected to the first node, a first electrode of the third transistor is connected to a first power supply line, and a second electrode of the third transistor is connected to the fourth node; a first electrode of the fourth transistor is connected to an initial signal line, and a second electrode of the fourth transistor is connected to the first node; and a first electrode of the fifth transistor is connected to the first power supply line, and a second electrode of the fifth transistor is connected to a second node.

In an exemplary embodiment, the pixel drive circuit further includes a storage capacitor and a threshold capacitor, the storage capacitor includes a first electrode plate and a second electrode plate of the storage capacitor, and the threshold capacitor includes a first electrode plate and a second electrode plate of the threshold capacitor; the first electrode plate of the storage capacitor is connected to a third node, and the second electrode plate of the storage capacitor is connected to the second node; and the first electrode plate of the threshold capacitor is connected to the first node, and the second electrode plate of the threshold capacitor is connected to the second node.

In an exemplary embodiment, the first electrode plate of the storage capacitor and the first electrode plate of the threshold capacitor are disposed on the first conductive layer, the first electrode plate of the storage capacitor and the first electrode plate of the threshold capacitor are arranged at intervals, and the first electrode plate of the storage capacitor is not overlapped with the semiconductor layer.

In an exemplary embodiment, the second electrode plate of the storage capacitor and the second electrode plate of the threshold capacitor are disposed on the second conductive layer and are connected to each other, there is an overlapping region between an orthographic projection of the second electrode plate of the storage capacitor on the substrate and an orthographic projection of the first electrode plate of the storage capacitor on the substrate, and there is an overlapping region between an orthographic projection of the second electrode plate of the threshold capacitor on the substrate and an orthographic projection of the first electrode plate of the threshold capacitor on the substrate.

In an exemplary embodiment, the fifth transistor is a double-gate transistor, and the fifth transistor at least includes a fifth active layer and two fifth gate electrodes; the electrode plate includes a first electrode plate, and there is an overlapping region between an orthographic projection of the first electrode plate on the substrate and an orthographic projection of the fifth active layer located between the two fifth gate electrodes on the substrate.

In an exemplary embodiment, the two fifth gate electrodes are disposed on the first conductive layer, the first electrode plate is disposed on the first conductive layer or the second conductive layer, and the first power supply line is disposed on the third conductive layer, wherein the first power supply line is connected to the first electrode plate through a via.

In an exemplary embodiment, the second conductive layer further includes a first power connection line, the first electrode plate is connected to the first power connection line, and the first power supply line is connected to the first power connection line through a via.

In an exemplary embodiment, the second transistor is a double-gate transistor, and the second transistor at least includes a second active layer and two second gate electrodes; the electrode plate includes a second electrode plate, and there is an overlapping region between an orthographic projection of the second electrode plate on the substrate and an orthographic projection of the second active layer located between the two second gate electrodes on the substrate.

In an exemplary embodiment, the two second gate electrodes are disposed on the first conductive layer, the second electrode plate is disposed on the first conductive layer or the second conductive layer, and the third conductive layer is further provided with a first connection electrode, wherein the first connection electrode is connected to the second electrode plate through a via.

In an exemplary embodiment, the first connection electrode is used as a second electrode of the first transistor and is connected to the first electrode plate of the storage capacitor through a via.

In an exemplary embodiment, the fourth transistor is a double-gate transistor, and the fourth transistor at least includes a fourth active layer and two fourth gate electrodes; and there is an overlapping region between an orthographic projection of the first connection electrode on the first power supply line and an orthographic projection of the fourth active layer located between the two fourth gate electrodes on the first power supply line.

In an exemplary embodiment, the third conductive layer is further provided with a second connection electrode, the second connection electrode is simultaneously used as the first electrode of the second transistor and the second electrode of the fourth transistor, and the second connection electrode is connected to the first electrode plate of the threshold capacitor through a via.

In an exemplary embodiment, the third conductive layer is further provided with a third connection electrode, the third connection electrode is used as the first electrode of the fourth transistor and is connected to the initial signal line through a via, and there is an overlapping region between an orthographic projection of the third connection electrode on the substrate and an orthographic projection of a fourth active layer between two gate electrodes of the fourth transistor on the substrate.

The present disclosure further provides a display apparatus, which includes the aforementioned display substrate.

The present disclosure further provides a preparation method of a display substrate. The display substrate includes a substrate and a plurality of sub-pixels, at least one sub-pixel includes a pixel drive circuit and a light emitting device connected to the pixel drive circuit, the pixel drive circuit includes a plurality of transistors, wherein at least one transistor includes an active layer and two gate electrodes. The preparation method includes: forming a semiconductor layer on the substrate and a plurality of conductive layers disposed on one side of the semiconductor layer away from the substrate, wherein at least one conductive layer is provided with at least one electrode plate, and there is an overlapping region between an orthographic projection of the electrode plate on the substrate and an orthographic projection of the active layer between the two gate electrodes on the substrate.

In an exemplary embodiment, the forming the semiconductor layer on the substrate and a plurality of conductive layers disposed on one side of the semiconductor layer away from the substrate includes: forming a semiconductor layer on the substrate; and sequentially forming a first conductive layer, a second conductive layer, and a third conductive layer on the semiconductor layer, wherein the electrode plate is on the first conductive layer, the second conductive layer, or the third conductive layer.

In an exemplary embodiment, at least one conductive layer is provided with a first power supply line connected to the pixel drive circuit, and at least one electrode plate is connected to the first power supply line.

After the accompanying drawings and detailed descriptions are read and understood, other aspects may be understood.

BRIEF DESCRIPTION OF DRAWINGS

The accompanying drawings are used for providing an understanding of technical solutions of the present application, and constitute a part of the specification. They are used for explaining the technical solutions of the present application together with the embodiments of the present application, and do not constitute limitations on the technical solutions of the present application.

Figure 1:
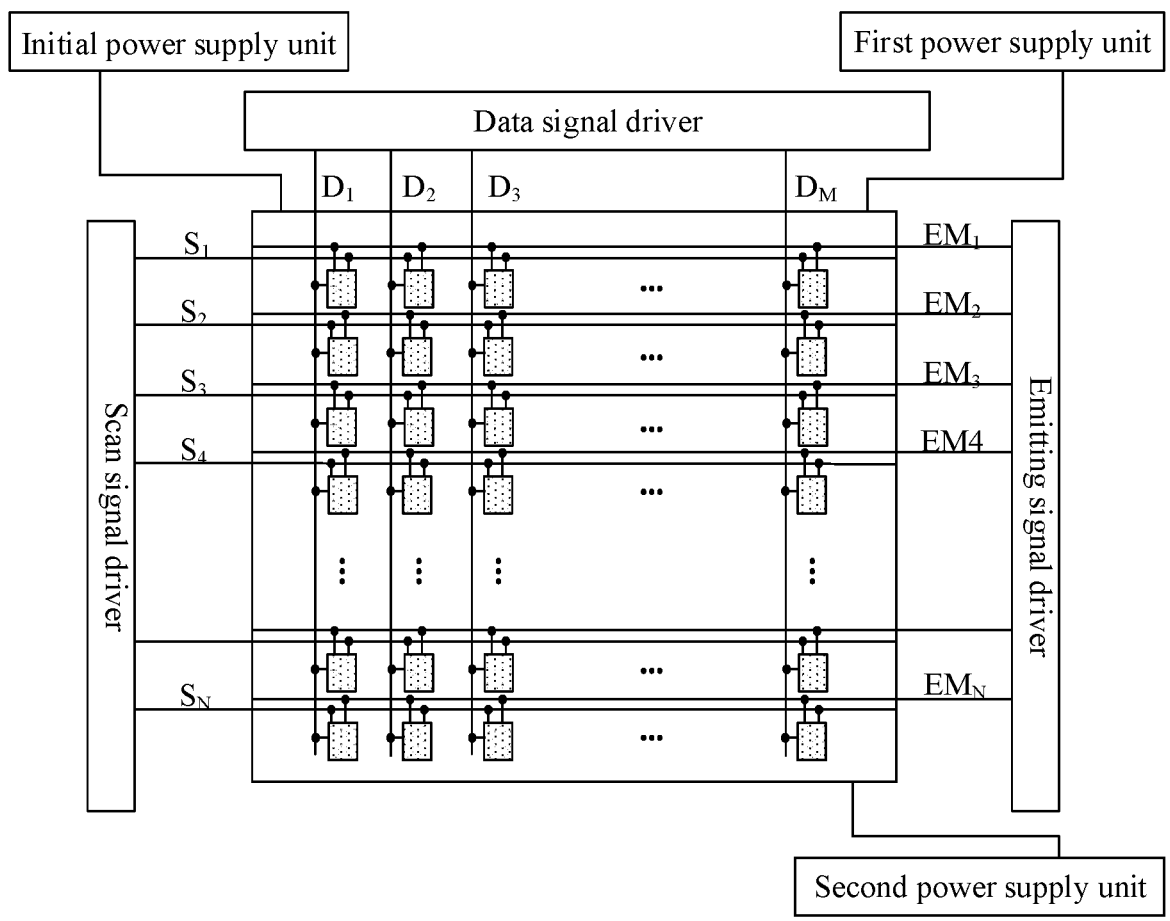
FIG. 1 is a schematic diagram of a structure of a display apparatus.

Description of reference signs is as follows.

| 11-first active layer; | 12-second active layer; | 13-third active layer; |
| 14-fourth active layer; | 15-fifth active layer; | 16-sixth active layer; |
| 17-seventh active layer; | 18-second active layer; | 21-first scan signal line |

| | | |
|---|---|---|
| 22-second scan signal line | 23-third scan signal line | 24-emitting control line; |
| 26-first electrode plate of a storage capacitor; | 27-first electrode plate of a threshold capacitor; | 31-initial signal line; |
| 32-reference signal connection line; | 33-first power connection line; | 34-second electrode plate of a storage capacitor; |
| 35-second electrode plate of a threshold capacitor; | 36-first electrode plate; | 37-second electrode plate; |
| 41-first connection electrode; | 42-second connection electrode; | 43-third connection electrode; |
| 44-fourth connection electrode; | 45-fifth connection electrode; | 46-sixth connection electrode; |
| 51-anode connection electrode; | 52-second power connection line; | 71-first power supply line; |
| 72-reference signal line; | 73-data signal line; | 74-second power supply line; |
| 101-substrate; | 102-drive circuit layer; | 103-light emitting device; |
| 104-encapsulation layer; | 301-anode; | 302-pixel define layer; |
| 303-organic light emitting layer; | 304-cathode; | 401-first encapsulation layer; |
| 402-second encapsulation layer; | 403-third encapsulation layer. | |

DETAILED DESCRIPTION

To make objectives, the technical solutions, and advantages of the present disclosure clearer, the embodiments of the present disclosure will be described in detail with reference to the accompanying drawings. It is noted that embodiments may be implemented in a plurality of different forms. Those of ordinary skill in the art may easily understand such a fact that manners and contents may be transformed into various forms without departing from the spirit and scope of the present disclosure. Therefore, the present disclosure should not be construed as only being limited to the contents recorded in following embodiments. The embodiments in the present disclosure and features in the embodiments may be combined arbitrarily with each other without conflict.

A scale of the drawings in the present disclosure may be used as a reference in an actual process, but is not limited thereto. For example, a width-to-length ratio of a channel, a thickness and spacing of each film layer, and a width and spacing of each signal line may be adjusted according to actual needs. A quantity of pixels in a display substrate and a quantity of sub-pixels in each pixel are not limited to quantities shown in the figures. The drawings described in the present disclosure are only schematic structural diagrams, and one embodiment of the present disclosure is not limited to shapes or numerical values shown in the drawings.

Ordinal numerals such as "first", "second", and "third" in the specification are set to avoid confusion of constituent elements, but are not intended to limit in terms of quantity.

In the specification, for convenience, words and sentences indicating orientations or positional relationships, such as "center", "upper", "lower", "front", "back", "vertical", "horizontal", "top", "bottom", "inside", and "outside", are used for describing positional relationships of constituent elements with reference to the accompanying drawings, and are merely for facilitating describing the specification and simplifying the description, rather than indicating or implying that referred apparatuses or elements must have particular orientations, and be constructed and operated in particular orientations. Thus, they cannot be construed as limitations to the present disclosure. The positional relationships of the constituent elements appropriately change according to directions of describing the constituent elements. Therefore, it is not limited to the words and sentences described in the specification, which may be replaced appropriately according to a situation.

In the specification, unless otherwise specified and defined explicitly, terms "mounted", "mutually connected", and "connection" should be broadly understood. For example, it may be a fixed connection, or a detachable connection, or an integral connection. It may be a mechanical connection or an electric connection. It may be a direct connection, or an indirect connection through an intermediate, or communication inside two elements. Those of ordinary skill in the art may understand specific meanings of these terms in the present disclosure in specific situations.

In the specification, a transistor refers to an element that at least includes three terminals, that is, a gate electrode, a drain electrode, and a source electrode. The transistor has a channel region between the drain electrode (drain electrode terminal, drain region, or drain electrode) and the source electrode (source electrode terminal, source region, or source electrode), and a current may flow through the drain electrode, the channel region, and the source region. It is to be noted that in the specification, a channel region refers to a region that a current mainly flows through.

In the specification, a first electrode may be a drain electrode, and a second electrode may be a source electrode. Or, a first electrode may be a source electrode, and a second electrode may be a drain electrode. In cases that transistors with opposite polarities are used, or a direction of a current changes during work of a circuit, or the like, functions of the "source electrode" and the "drain electrode" may sometimes be exchanged. Therefore, the "source electrode" and the "drain electrode" may be exchanged in the specification.

In the specification, an "electric connection" includes a case where constituent elements are connected together through an element having some electric function. There is no specific restriction on the "element having some electrical function" as long as it may transmit and receive electrical signals between connected constituent elements. An example of the "element having some electric function" includes not only an electrode and a wiring, but also a switching element such as a transistor, a resistor, an inductor, a capacitor, and another element having various functions, etc.

In the specification, "parallel" refers to a state in which an angle formed by two straight lines is greater than −10° and less than 10°, and thus may also include a state in which an angle is greater than −5° and less than 5°. In addition, "perpendicular" refers to a state in which an angle formed by two straight lines is greater than 80° and less than 100°, and thus may also include a state in which an angle is greater than 85° and less than 95°.

In the specification, a "film" and a "layer" may be exchanged. For example, a "conductive layer" may be replaced with a "conductive film" sometimes. Similarly, an "insulation film" may be replaced with an "insulation layer" sometimes.

In the present disclosure, "about" refers to that a boundary is defined not so strictly and numerical values within process and measurement error ranges are allowed.

FIG. 1 is a schematic diagram of a structure of a display apparatus. As shown in FIG. 1, an OLED display apparatus may include a scan signal driver, a data signal driver, an emitting signal driver, an OLED display panel, a first power supply unit, a second power supply unit, and an initial power supply unit. In an exemplary embodiment, an OLED display substrate at least includes a plurality of scan signal lines ($S_1$ to $S_N$), a plurality of data signal lines ($D_1$ to $D_M$), and a plurality of emitting signal lines ($EM_1$ to $EM_N$); the scan signal driver is configured to sequentially supply scan signals to the plurality of scan signal lines ($S_1$ to $S_N$), the data signal driver is configured to supply data signals to the plurality of data signal lines ($D_1$ to $D_M$), and the emitting signal driver is configured to sequentially supply emitting control signals to the plurality of emitting signal lines ($EM_1$ to $EM_N$). In an exemplary embodiment, the plurality of scan signal lines and the plurality of emitting signal lines extend along a horizontal direction, and the plurality of data signal lines extend along a vertical direction. The display apparatus includes a plurality of sub-pixels, at least one sub-pixel includes a pixel drive circuit and a light emitting device, and the pixel drive circuit of one sub-pixel may be connected to a scan signal line, an emitting control line, and a data signal line. The first power supply unit, the second power supply unit, and the initial power supply unit are respectively configured to provide a first power supply voltage, a second power supply voltage, and an initial power supply voltage to the pixel drive circuit through a first power supply line, a second power supply line, and an initial signal line.

Figure 2:
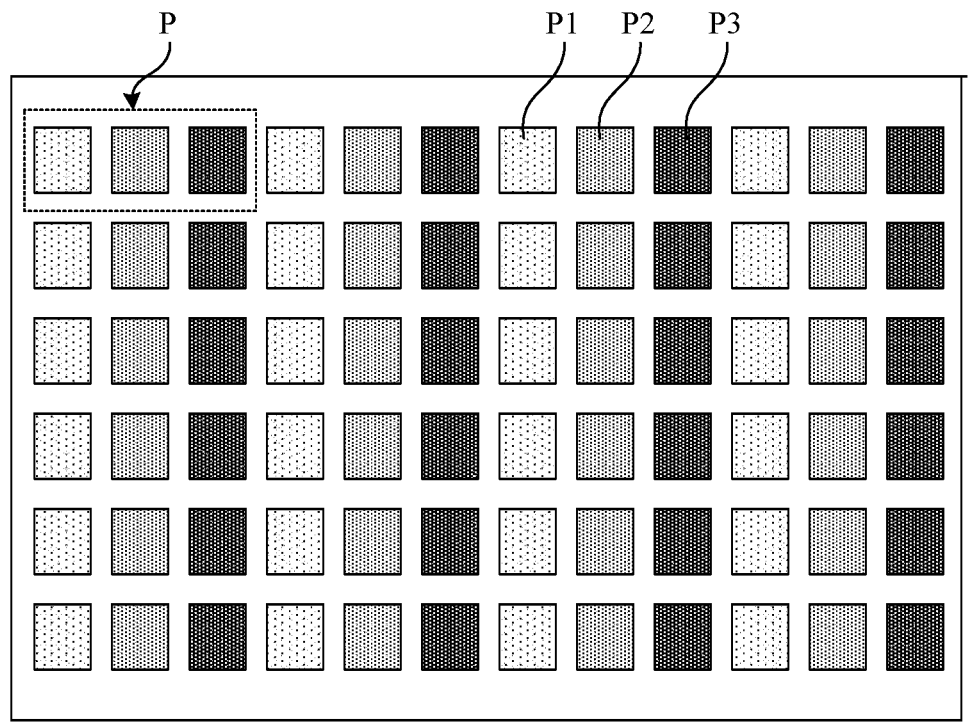
FIG. 2 is a schematic diagram of a planar structure of a display substrate.

FIG. 2 is a schematic diagram of a planar structure of a display substrate. As shown in FIG. 2, the display substrate may include a plurality of pixel units P arranged in a matrix, at least one of the plurality of pixel units P includes a first sub-pixel P1 emitting light of a first color, a second sub-pixel P2 emitting light of a second color, and a third sub-pixel P3 emitting light of a third color, and the first sub-pixel P1, the second sub-pixel P2, and the third sub-pixel P3 each includes a pixel drive circuit and a light emitting device. Each pixel drive circuit in the first sub-pixel P1, the second sub-pixel P2, and the third sub-pixel P3 is respectively connected to a scan signal line, a data signal line, and an emitting signal line. The pixel drive circuit is configured to receive a data voltage transmitted through the data signal line under control of the scan signal line and the emitting signal line, and output a corresponding current to the light emitting device. Each light emitting device in the first sub-pixel P1, the second sub-pixel P2, and the third sub-pixel P3 is respectively connected to a pixel drive circuit of a sub-pixel where the light emitting device is located. The light emitting device is configured to emit light with a corresponding brightness in response to a current output by the pixel drive circuit of the sub-pixel where the light emitting device is located.

In an exemplary embodiment, a pixel unit P may include a red (R) sub-pixel, a green (G) sub-pixel, and a blue (B) sub-pixel, or may include a red sub-pixel, a green sub-pixel, a blue sub-pixel, and a white (W) sub-pixel, which is not limited in the present disclosure. In an exemplary embodiment, a shape of a sub-pixel in a pixel unit may be a rectangle, a rhombus, a pentagon, or a hexagon. When the pixel unit includes three sub-pixels, the three sub-pixels may be arranged in a manner to stand side by side horizontally, in a manner to stand side by side vertically, or in a manner like a Chinese character "品". When the pixel unit includes four sub-pixels, the four sub-pixels may be arranged in a manner to stand side by side horizontally, in a manner to stand side by side vertically, or in a manner to form a square, which is not limited in the present disclosure.

Figure 3:
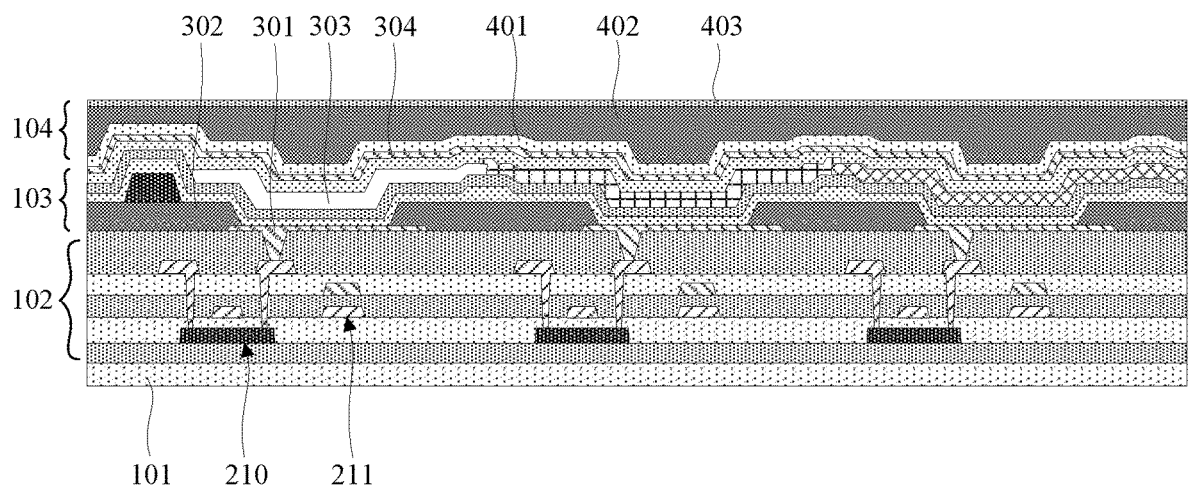
FIG. 3 is a schematic diagram of a cross-sectional structure of a display substrate.

FIG. 3 is a schematic diagram of a cross-sectional structure of a display substrate, which illustrates structures of three sub-pixels of an OLED display substrate. As shown in FIG. 3, on a plane perpendicular to the display substrate, the display substrate may include a drive circuit layer 102 disposed on a substrate 101, a light emitting device 103 disposed on a side of the drive circuit layer 102 away from the substrate 101, and an encapsulation layer 104 disposed on a side of the light emitting device 103 away from the substrate 101. In some possible embodiments, the display substrate may include other film layers, such as a post spacer, which is not limited in the present disclosure.

In an exemplary embodiment, a drive circuit layer 102 of each sub-pixel may include a plurality of transistors and a storage capacitor constituting a pixel drive circuit. FIG. 3 illustrates by taking as an example that each sub-pixel includes one drive transistor and one storage capacitor. In some possible embodiments, the drive circuit layer 102 of each sub-pixel may include: a first insulation layer disposed on the substrate; an active layer disposed on the first insulation layer; a second insulation layer covering the active layer; a gate electrode and a first electrode plate disposed on the second insulation layer; a third insulation layer covering the gate electrode and the first electrode plate; a second electrode plate disposed on the third insulation layer; a fourth insulation layer covering the second electrode plate, vias being provided in the second, third, and fourth insulation layers exposing the active layer; a source electrode and a drain electrode disposed on the fourth insulation layer, the source electrode and the drain electrode being connected respectively to the active layer through the vias; and a planarization layer covering the aforementioned structures, a via being provided in the planarization layer exposing the drain electrode. The active layer, the gate electrode, the source electrode, and the drain electrode form a drive transistor 210, and the first electrode plate and the second electrode plate form a storage capacitor 211.

In an exemplary embodiment, the light emitting device 103 may include an anode 301, a pixel define layer 302, an organic light emitting layer 303, and a cathode 304. The anode 301 is disposed on the planarization layer, and is connected to the drain electrode of the drive transistor 201 through the via disposed on the planarization layer; the pixel define layer 302 is disposed on the anode 301 and the planarization layer, and the pixel define layer 302 is provided with a pixel opening exposing the anode 301; the organic light emitting layer 303 is at least partially disposed in the pixel opening, and is connected to the anode 301; the cathode 304 is disposed on the organic light emitting layer 303, and is connected to the organic light emitting layer 303; and the organic light emitting layer 303 emits light of corresponding colors under drive of the anode 301 and the cathode 304.

In an exemplary embodiment, the encapsulation layer 104 may include a first encapsulation layer 401, a second encapsulation layer 402, and a third encapsulation layer 403 that are stacked together; the first encapsulation layer 401 and the third encapsulation layer 403 may be made of an inorganic material, and the second encapsulation layer 402 may be made of an organic material; the second encapsulation layer 402 is disposed between the first encapsulation layer 401 and the third encapsulation layer 403 to ensure that external vapor cannot enter into the light emitting device 103.

In an exemplary embodiment, an organic light emitting layer 303 may at least include a hole injection layer, a hole transport layer, an emitting layer, and a hole block layer which are stacked on the anode 301. In an exemplary embodiment, hole injection layers of all sub-pixels are common layers connected together, hole transport layers of all sub-pixels are common layers connected together, emitting layers of adjacent sub-pixels may be slightly overlapped with each other or may be isolated, and hole block layers are common layers connected together.

Figure 4:
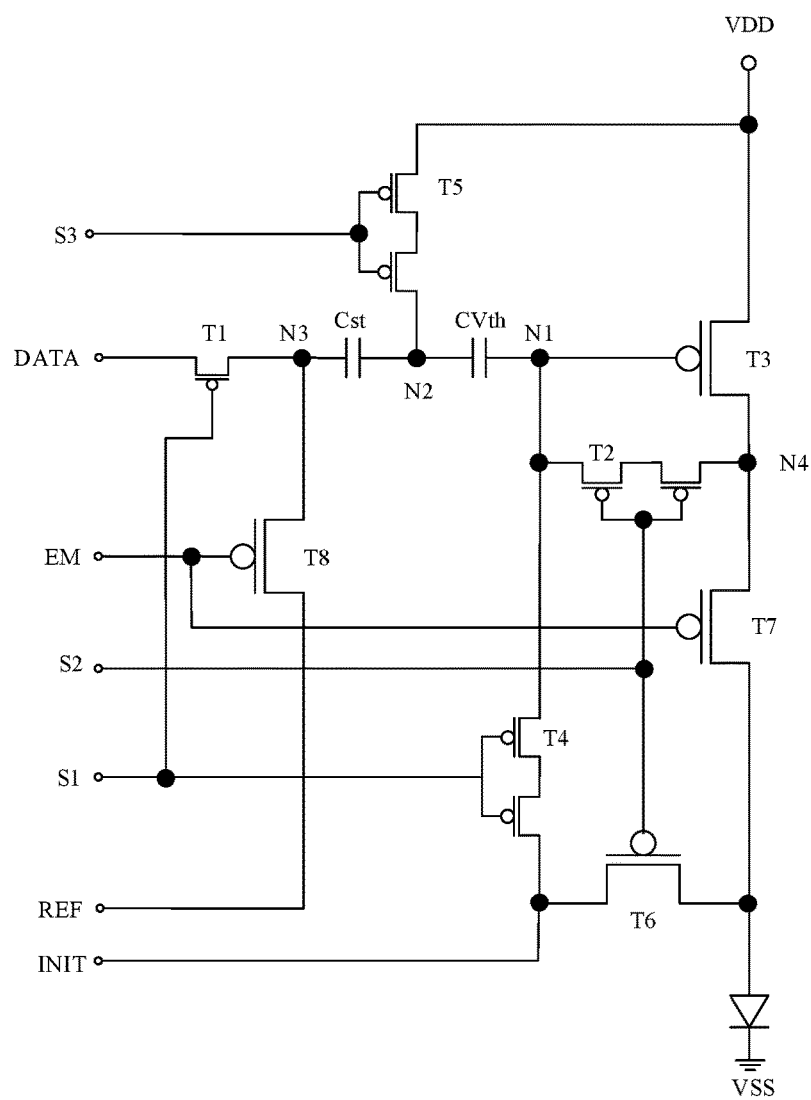
FIG. 4 is a schematic diagram of an equivalent circuit of a pixel drive circuit.

In an exemplary embodiment, the pixel drive circuit may have a structure of 3T1C, 4T1C, 5T1C, 5T2C, 6T1C, 7T1C, or 8T2C. FIG. 4 is a schematic diagram of an equivalent circuit of a pixel drive circuit, illustrating a structure of 8T2C. As shown in FIG. 4, the pixel drive circuit may include eight switching transistors (a first transistor T1 to an eighth transistor T8), two capacitors (a storage capacitor Cst and a threshold capacitor CVth), and the pixel drive circuit is respectively connected to nine signal lines including a first scan signal line S1, a second scan signal line S2, a third scan signal line S3, an emitting signal line EM, a reference signal line REF, an initial signal line INIT, a data signal line DATA, a first power supply line VDD, and a second power supply line VSS. In an exemplary embodiment, a gate electrode of the first transistor T1 is connected to the first scan signal line S1, a first electrode of the first transistor T1 is connected to the data signal line DATA, and a second electrode of the first transistor is connected to a third node N3. A gate electrode of the second transistor T2 is connected to the second scan signal line S2, a first electrode of the second transistor T2 is connected to a first node N1, and a second electrode of the second transistor T2 is connected to a fourth node N4. A gate electrode of the third transistor T3 is connected to the first node N1, a first electrode of the third transistor T3 is connected to the first power supply line VDD, and a second electrode of the third transistor T3 is connected to the fourth node N4. A gate electrode of the fourth transistor T4 is connected to the first scan signal line S1, a first electrode of the fourth transistor T4 is connected to the initial signal line INIT, and a second electrode of the fourth transistor T4 is connected to the first node N1. A gate electrode of the fifth transistor T5 is connected to the third scan signal line S3, a first electrode of the fifth transistor T5 is connected to the first power supply line VDD, and a second electrode of the fifth transistor T5 is connected to the second node N2. A gate electrode of the sixth transistor T6 is connected to the second scan signal line S2, a first electrode of the sixth transistor T6 is connected to the initial signal line INIT, and a second electrode of the sixth transistor T6 is connected to a first electrode of the light emitting device. A gate electrode of the seventh transistor T7 is connected to the emitting signal line EM, a first electrode of the seventh transistor T7 is connected to the fourth node N4, and a second electrode of the seventh transistor T7 is connected to the first electrode of the light emitting device. A gate electrode of the eighth transistor T8 is connected to the emitting signal line EM, a first electrode of the eighth transistor T8 is connected to the reference signal line REF, and a second electrode of the sixth transistor T8 is connected to the third node N3. A first terminal of the threshold capacitor CVth is connected to the first node N1, and a second terminal of the threshold capacitor CVth is connected to the second node N2. A first terminal of the storage capacitor Cst is connected to the second node N2, and a second terminal of the storage capacitor Cst is connected to the third node N3.

In an exemplary embodiment, the first transistor T1 to the eighth transistor T8 may be P-type transistors or N-type transistors. Adopting a same type of transistors in a pixel drive circuit may simplify a process flow, reduce process difficulties of a display panel, and improve a yield of a product. In some possible embodiments, the first transistor T1 to the eighth transistor T8 may include P-type transistors and N-type transistors.

In an exemplary embodiment, a second electrode of the light emitting device is connected to the second power supply line VSS, a signal of the second power supply line VSS is a low-level signal and a signal of the first power supply line VDD is a high-level signal continuously provided.

In an exemplary embodiment, the second scan signal line S2 is a scan signal line in a pixel drive circuit of a current display row, and the third scan signal line S3 is a scan signal line in a pixel drive circuit of a previous display row. That is, for an n-th display row, a second scan signal line S2 is S(n), a third scan signal line S3 is S(n−1), and a third scan signal line S3 of the current display row and a second scan signal line S2 in the pixel drive circuit of the previous display row are a same signal line. In other words, the second scan signal line S2 of the current display row and a third scan signal line S3 in a pixel drive circuit of a next display row may be a same signal line, so that signal lines of a display panel may be reduced, thereby achieving narrow bezels of the display panel.

In an exemplary embodiment, the first scan signal line S1, the second scan signal line S2, the third scan signal line S3, the emitting signal line EM, and the initial signal line INIT may extend along a horizontal direction, and the data signal line DATA, the first power supply line VDD, the second power supply line VSS, and the reference signal line REF may extend along a vertical direction.

In an exemplary embodiment, the light emitting device may be an Organic Light Emitting Device (OLED), including a first electrode (anode), an organic light emitting layer, and a second electrode (cathode) that are stacked.

Figure 5:
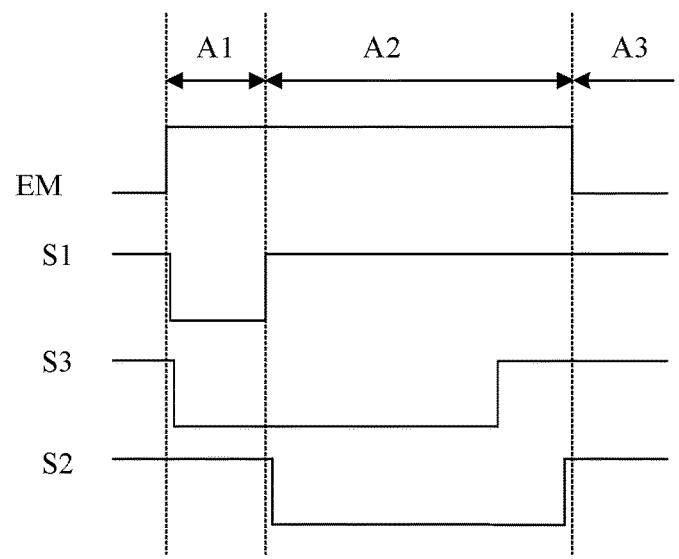
FIG. 5 is a working timing diagram of a pixel drive circuit.

FIG. 5 is a working timing diagram of a pixel drive circuit. An exemplary embodiment of the present disclosure will be described below through a working process of the pixel drive circuit illustrated in FIG. 4. The pixel drive circuit in FIG. 4 includes eight switching transistors (the first transistor T1 to the eighth transistor T8), two capacitors (the storage capacitor Cst and the threshold capacitor CVth), and nine signal lines (the first scan signal line S1, the second scan signal lines S2, the third scan signal lines S3, the emitting signal lines EM, the reference signal line REF, the initial signal line INIT, the data signal line DATA, the first power supply line VDD, and the second power supply line VSS), all eight transistors are P-type transistors.

In an exemplary embodiment, the working process of the pixel drive circuit may include following stages.

In a first stage A1, which is referred to as a reset and data refresh stage, signals of the first scan signal line S1 and the third scan signal line S3 are low-level signals, and signals of the second scan signal line S2 and the emitting signal line EM are high-level signals. A signal of the first scan signal line S1 is a low-level signal, so that the first transistor T1 and the fourth transistor T4 are turned on. The first transistor T1 is turned on so that a data voltage output from the data signal line DATA is supplied to the third node N3, and the third node N3 writes a data voltage Vdt. The fourth transistor T4 is turned on so that an initial signal of the initial signal line INIT is supplied to the first node N1, and the first node N1 is reset to an initial voltage Vinit. A signal of the third scan signal line S3 is a low-level signal, so that the fifth transistor T5 is turned on, a power supply voltage output from the first power supply line VDD is supplied to the second node N2, and the second node N2 writes a power supply voltage Vdd.

In a second stage A2, which is referred to as a threshold acquisition stage, signals of the second scan signal line S2 and the third scan signal line S3 are low-level signals, and signals of the first scan signal line S1 and the emitting signal line EM are high-level signals. A signal of the third scan signal line S3 is a low-level signal, so that the fifth transistor T5 continues to be turned on, the power supply voltage output from the first power supply line VDD is supplied to the second node N2, and the second node N2 maintains the power supply voltage Vdd. A signal of the second scan signal line S2 is a low-level signal, so that the second transistor T2 and the sixth transistor T6 are turned on. The second transistor T2 is turned on so that the first node N1 and the fourth node N4 have a same potential. The third transistor T3 forms a "diode-connected" structure, the first power supply line VDD charges the first node N1. The first node N1 is turned off after being charged to a potential of Vdd-|Vth|, and information with a threshold voltage of the third transistor T3 is stored in the threshold capacitor CVth. The sixth transistor T6 is turned on so that an initial signal of the initial signal line INIT is supplied to a first electrode of the OLED, and the first electrode of the OLED is reset to the initial voltage Vinit.

In a third stage A3, which is referred to as a light emitting stage, a signal of the emitting signal line EM is a low-level signal, and signals of the first scan signal line S1, the second scan signal line S2, and the third signal line S3 are high-level signals. The signal of the emitting signal line EM is a low-level signal, so that the seventh transistor T7 and the eighth transistor T8 are turned on. The seventh transistor T7 is turned on, and the potential of the first node N1 causes the third transistor T3 to be turned on. The power supply voltage output by the first power supply line VDD supplies a driving voltage to the first electrode of the OLED through the turned-on third transistor T3 and the seventh transistor T7, thereby driving the OLED to emit light. The eighth transistor T8 is turned on, so that a reference signal of the reference signal line REF is supplied to the third node N3 and a potential of the third node N3 changes from the data voltage Vdt to a reference voltage Vref. After signals are superimposed, the potential of the first node N1 changes to Vdd-|Vth|+(Vref-Vdt). The signal of the first scan signal line S1 is a low-level signal so that the first transistor T1 is turned on, the data signal line DATA outputs a data voltage to the second node N2, and the second node N2 writes the data voltage Vdt. After signals of the first node N1 and the second node N2 are superimposed, the potential of the first node N1 is Vdd-|Vth|+(Vref-Vdt). After that, the first node N1 is suspended, and an original potential is maintained by a capacitor. In a driving process of the pixel drive circuit, a driving current flowing through the third transistor T3 (driving transistor) is determined by a voltage difference between the gate electrode and first electrode thereof. Therefore, according to the potential of the first node N1, the driving current flowing through the third transistor T3 is as follow.

$$I=\beta^{*}(Vref-Vdt)2$$

I is the driving current flowing through the third transistor T3, that is, a driving current driving the OLED; β is a constant; Vdt is the data voltage output by the data signal line DATA; and Vref is the reference voltage output by the reference signal line REF. Since the information of the threshold voltage of the third transistor T3 is not included in the driving current formula, the pixel drive circuit has a self-compensating effect on the threshold voltage of the third transistor T3.

During the operation of the pixel drive circuit, in the reset stage, the potential of the first node N1 is the initial voltage Vinit, a potential of the second node N2 is the power supply voltage Vdd, and the potential of the third node N3 is the data voltage Vdt. In the threshold acquisition stage, the potential of the first node N1 is Vdd-|Vth|, the potential of the second node N2 is the power supply voltage Vdd, and the potential of the third node N3 is the data voltage Vdt. In the emitting stage, the potential of the first node N1 is Vdd-|Vth|+(Vref-Vdt), the potential of the second node N2 is Vdd+Vref-Vdt, and the potential of the third node N3 is the reference voltage Vref.

Figure 6:
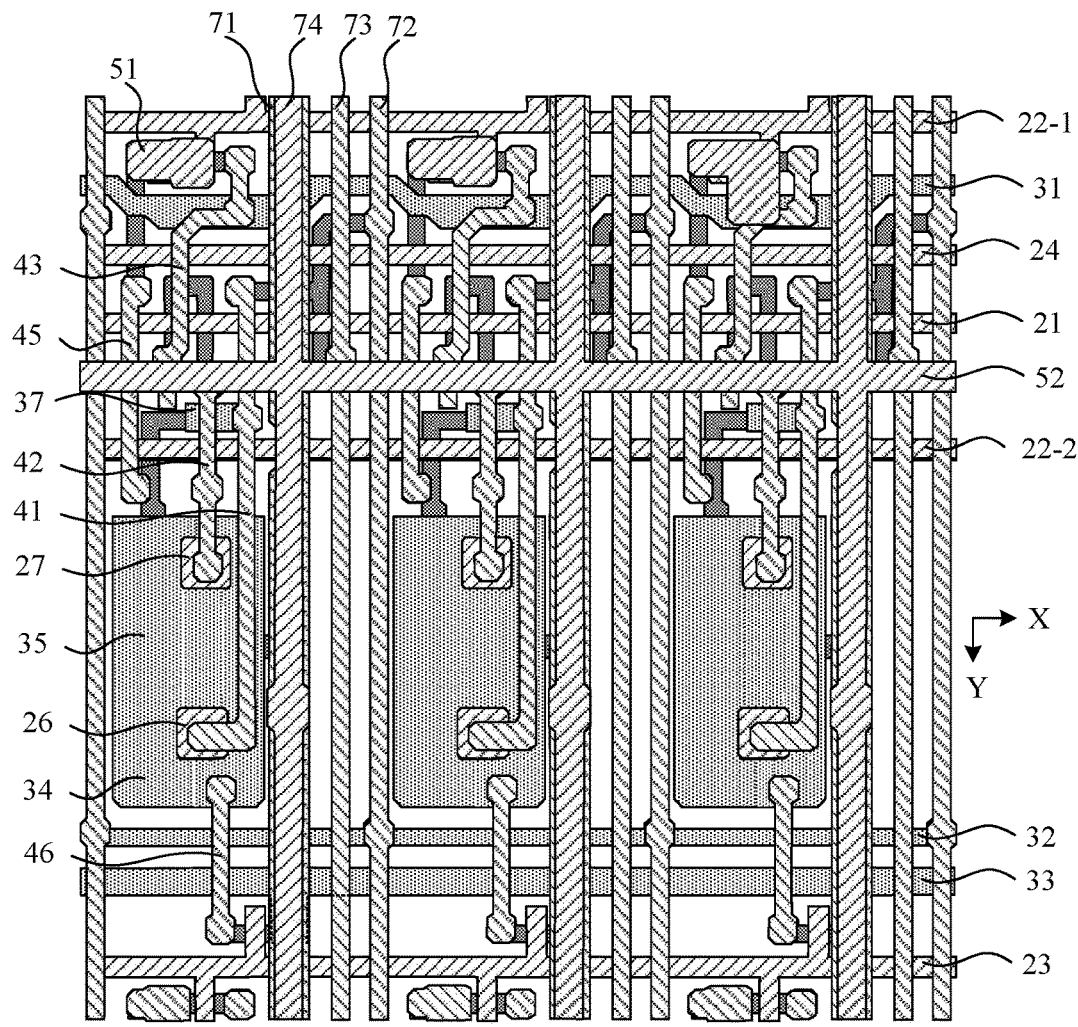
FIG. 6 is a schematic diagram of a structure of a display substrate according to an exemplary embodiment of the present disclosure.

FIG. 6 is a schematic diagram of a structure of a display substrate according to an exemplary embodiment of the present disclosure, illustrating a planar structure of three sub-pixels. As shown in FIG. 6, in a plane parallel to the display substrate, the sub-pixels of the display substrate are provided with a first scan signal line 21 and two second scan signal lines 22 (a second scan signal line 22-1 and a second scan signal line 22-1), a third scan signal line 23, an emitting control line 24, an initial signal line 31, a first power supply line 71, a reference signal line 72, a data signal line 73, a second power supply line 74, a pixel drive circuit, and a light emitting device. The pixel drive circuit may include a storage capacitor, a threshold capacitor, and a plurality of transistors, wherein each transistor includes an active layer, a gate electrode, a first electrode, and a second electrode. The storage capacitor includes a first electrode plate 26 and a second electrode plate 34 of the storage capacitor, and the threshold capacitor includes a first electrode plate 27 and a second electrode plate 35 of the threshold capacitor. In an exemplary embodiment, the pixel drive circuit is connected to the first power supply line 71 which supplies a high-level signal to the pixel drive circuit. In an exemplary embodiment, at least one transistor is a double-gate transistor that includes an active layer, two gate electrodes, a first electrode, and a second electrode. In an exemplary embodiment, the display substrate further includes at least one electrode plate, there is an overlapping region between an orthographic projection of the at least one electrode plate on the substrate and an orthographic projection of the active layer located between the two gate electrodes on the substrate, and the at least one electrode plate is connected to the first power supply line 71.

In a plane perpendicular to the display substrate, the display substrate may include a semiconductor layer and a plurality of conductive layers that are sequentially disposed on the substrate, wherein at least one conductive layer is provided with an electrode plate. In an exemplary embodiment, the plurality of conductive layers may include a first conductive layer, a second conductive layer, a third conductive layer, and a fourth conductive layer that are sequentially disposed on the semiconductor layer. At least one electrode plate may be disposed on the first conductive layer or the second conductive layer, the first power supply line 71 is disposed on the third conductive layer, and the first power supply line 71 is connected to the electrode plate through a via.

In the exemplary embodiment, the semiconductor layer may include active layers of the plurality of transistors. The first conductive layer may include the first scan signal line 21, the second scan signal line 22-1, the second scan signal line 22-2, the third scan signal line 23, an emitting control line, the first electrode plate 26 of the storage capacitor, and the first electrode plate 27 of the threshold capacitor. The second conductive layer may include the initial signal line 31, the second electrode plate 34 of the storage capacitor, and the second electrode plate 35 of the threshold capacitor. The third conductive layer may include the first power supply line 71, the reference signal line 72, and the data signal line 73, and the fourth conductive layer may include the second power supply line 74.

In the exemplary embodiment, the first scan signal line 21, the second scan signal line 22-1, the second scan signal line 22-2, the third scan signal line 23, and the emitting control line 24 extend along a first direction X, and the first electrode plate 26 of the storage capacitor and the first electrode plate 27 of the threshold capacitor are disposed at intervals. The initial signal line 31 extends along the first direction X and the second electrode plate 34 of the storage capacitor and the second electrode plate 35 of the threshold capacitor are an integral structure connected to each other. The first power supply line 71, the reference signal line 72, the data signal line 73, and the second power supply line 74 extend along a second direction Y. The first direction X may be an extension direction of a scan signal line, and the second direction Y may be an extension direction of a data signal line.

In an exemplary embodiment, the second conductive layer may include a reference signal connection line 32 and a first power connection line 33. Both the reference signal connection line 32 and the first power connection line 33 extend along the first direction X. The reference signal connection line 32 is connected to the reference signal line 72, and the first power connection line 33 is connected to the first power supply line 71, so that each sub-pixel in a sub-pixel row has a same reference voltage and a power supply voltage, thereby improving display uniformity.

In an exemplary embodiment, the pixel drive circuit may include a first transistor T1, a second transistor T2, a third transistor T3, a fourth transistor T4, and a fifth transistor T5. A first electrode of the first transistor T1 is connected to the data signal line 74, and a second electrode of the first transistor T1 is connected to the first electrode plate 26 of the storage capacitor; a first electrode of the second transistor T2 is connected to the first electrode plate 27 of the threshold capacitor, and a second electrode of the second transistor T2 is connected to a second electrode of the third transistor T3; a gate electrode of the third transistor T3 is connected to the first electrode plate 27 of the threshold capacitor, and a first electrode of the third transistor T3 is connected to the first power supply line 71; a first electrode of the fourth transistor T4 is connected to the initial signal line 31, and a second electrode of the fourth transistor T4 is connected to the first electrode plate 27 of the threshold capacitor; a first electrode of the fifth transistor T5 is connected to the first power supply line 71, and a second electrode of the fifth transistor T5 is connected to the second electrode plate 34 of the storage capacitor and the second electrode plate 35 of the threshold capacitor.

In an exemplary embodiment, the second transistor T2, the fourth transistor T4, and the fifth transistor T5 are double-gate transistors. The second conductive layer may include a first electrode plate 36 and a second electrode plate 37. The first electrode plate 36 is configured to introduce a first parasitic capacitor at a double-gate intermediate node of the fifth transistor T5, and the second electrode plate 37 is configured to introduce a second parasitic capacitor at a double-gate intermediate node of the second transistor T2. In an exemplary embodiment, the third conductive layer may include a first connection electrode 41 configured to introduce a third parasitic capacitor at a double-gate intermediate node of the fourth transistor T4.

In the exemplary embodiment, the first electrode plate 36 is directly connected to the first power connection line 33, and the second electrode plate 37 is connected to the first connection electrode 41 through a via.

In an exemplary embodiment, the third conductive layer may include a first connection electrode 41, a second connection electrode 42, a third connection electrode 43, a fourth connection electrode 44, a fifth connection electrode 45, and a sixth connection electrode 46. The first connection electrode 41 is used as a second electrode of the first transistor T1 and a second electrode of the eighth transistor T8 at the same time, the second connection electrode 42 is used as a first electrode of the second transistor T2 and a second electrode of the fourth transistor T4 at the same time, the third connection electrode 43 is used as a first electrode of the fourth transistor T4 and a first electrode of the sixth transistor T6 at the same time, the fourth connection electrode 44 is used as a second electrode of the sixth transistor T6 and a second electrode of the seventh transistor T7 at the same time, the fifth connection electrode 45 is used as a second electrode of the second transistor T2, a second electrode of the third transistor T3, and a first electrode of the seventh transistor T7 at the same time, and the sixth connection electrode 46 is used as a second electrode of the fifth transistor T5.

In an exemplary embodiment, the fourth conductive layer may include an anode connection electrode 51 and a second power connection line 52. The anode connection electrode 51 is configured to connect the fourth connection electrode 44 and an anode of a light emitting device, and the second power connection line 52 extends along the first direction X and is connected to the second power supply line 74, so that each sub-pixel in a sub-pixel row has a same second power supply voltage, improving display uniformity.

In an exemplary embodiment, the display substrate may include a first insulation layer, a second insulation layer, a third insulation layer, a fourth insulation layer, and a fifth insulation layer. The first insulation layer is disposed between the substrate and the semiconductor layer, the second insulation layer is disposed between the semiconductor layer and the first conductive layer, the third insulation layer is disposed between the first and second conductive layers, the fourth insulation layer is disposed between the second and third conductive layers, and the fifth insulation layer is disposed between the third and fourth conductive layers.

In the display substrate according to the exemplary embodiment of the present disclosure, an instantaneous high voltage of a double-gate intermediate node is avoided by setting a parasitic capacitor at the double-gate intermediate node of a double-gate transistor, which eliminates reverse leakage of the double-gate intermediate node, effectively stabilizes a potential of a key node, ensures accuracy of a driving current, and improves a display effect.

A preparation process of the display substrate will be exemplarily described below. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a thin film prepared from a material on a substrate through a process such as deposition, coating, or other treatments. If the "thin film" does not need a patterning process in an entire preparation process, the "thin film" may also be called a "layer". If the "thin film" needs the patterning process in the entire preparation process, it is called a "thin film" before the patterning process, and called a "layer" after the patterning process. The "layer" obtained after the patterning process includes at least one "pattern". "A and B are arranged in a same layer" mentioned in the present disclosure refers to that A and B are formed simultaneously through a same patterning process, and a "thickness" of a film layer is a dimension of the film layer in a direction perpendicular to the display substrate. In an exemplary embodiment of the present disclosure, "an orthographic projection of B is located within a range of an orthographic projection of A" refers to that a boundary of the orthographic projection of B falls within a range of a boundary of the orthographic projection of A, or a boundary of the orthographic projection of A is overlapped with a boundary of the orthographic projection of B. "An orthographic projection of A includes an orthographic projection of B" means that a boundary of the orthographic projection of B falls within a range of boundary of the orthographic projection of A, or a boundary of the orthographic projection of A is overlapped with a boundary of the orthographic projection of B.

In an exemplary embodiment, taking three sub-pixels in a sub-pixel row of the display substrate as an example, a preparation process of the display substrate may include following operations.

Figure 7:
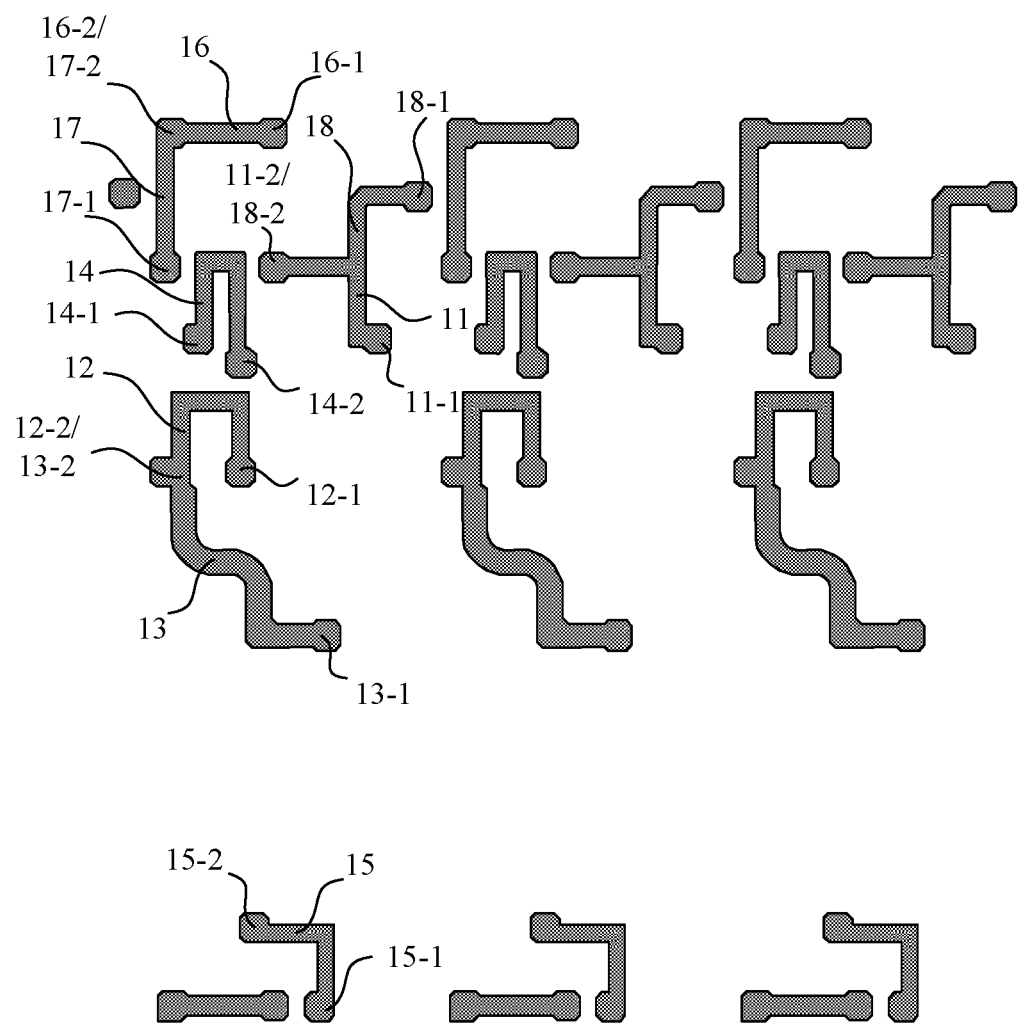
FIG. 7 is a schematic diagram after a pattern of a semiconductor layer is formed according to an exemplary embodiment of the present disclosure.

(1) A semiconductor layer pattern is formed. In an exemplary embodiment, forming a pattern of a semiconductor layer may include: depositing a first insulation thin film and a semiconductor thin film in sequence on the substrate, patterning the semiconductor thin film through a patterning process to form a first insulation layer covering the substrate and a semiconductor layer disposed on the first insulation layer, as shown in FIG. 7.

In an exemplary embodiment, a semiconductor layer of at least one sub-pixel may include a first active layer of the first transistor T1 to an eighth active layer of the eighth transistor T8. A first active layer 11 of the first transistor T1 and an eighth active layer 18 of the eighth transistor T8 are an integral structure connected to each other, a second active layer 12 of the second transistor T2 and a third active layer 13 of the third transistor T3 are an integral structure connected to each other, and a sixth active layer 16 of the sixth transistor T6 and a seventh active layer 17 of the seventh transistor T7 are an integral structure connected to each other. A fourth active layer 14 of the fourth transistor T4 is separately arranged, and a fifth active layer 15 of the fifth transistor T5 is separately arranged.

In an exemplary embodiment, an active layer of each transistor may include a first region, a second region, and a channel region located between the first region and the second region.

In an exemplary embodiment, a first region 11-1 of the first active layer 11 is separately arranged. A second region 11-2 of the first active layer 11 simultaneously is used as a second region 18-2 of the eighth active layer 18, i.e., the second region 11-2 of the first active layer 11 is connected to the second region 18-2 of the eighth active layer 18.

In the exemplary embodiment, a first region 12-1 of the second active layer 12 is separately arranged. A second region 12-2 of the second active layer 12 is simultaneously used as a second region 13-2 of the third active layer 13, i.e., the second region 12-2 of the second active layer 12 is connected to the second region 13-2 of the third active layer 13.

In the exemplary embodiment, a first region 13-1 of the third active layer 13 is separately arranged. A second region 13-2 of the third active layer 13 is simultaneously used as a second region 12-2 of the third active layer 12, i.e., the second region 13-2 of the third active layer 13 is connected to the second region 12-2 of the second active layer 12.

In the exemplary embodiment, a first region 14-1 of the fourth active layer 14 and a second region 14-2 of the fourth active layer 15 are both arranged separately. A first region 15-1 of the fifth active layer 15 and a second region 15-2 of the fifth active layer 15 are both arranged separately.

In an exemplary embodiment, a first region 16-1 of the sixth active layer 16 is separately arranged. A second region 16-2 of the sixth active layer 16 simultaneously is used as a second region 17-2 of the seventh active layer 17, i.e., the second region 16-2 of the sixth active layer 16 is connected to the second region 17-2 of the seventh active layer 17.

In an exemplary embodiment, a first region 17-1 of the seventh active layer 17 is separately arranged. A second region 17-2 of the seventh active layer 17 is simultaneously used as a second region 16-2 of the sixth active layer 16, i.e., the second region 17-2 of the seventh active layer 17 is connected to the second region 16-2 of the sixth active layer 16.

In an exemplary embodiment, a first region 18-1 of the eighth active layer 18 is separately arranged. A second region 18-2 of the eighth active layer 18 simultaneously is used as a second region 11-2 of the first active layer 11, i.e., the second region 18-2 of the eighth active layer 18 is connected to the second region 11-2 of the first active layer 11.

Figure 8:
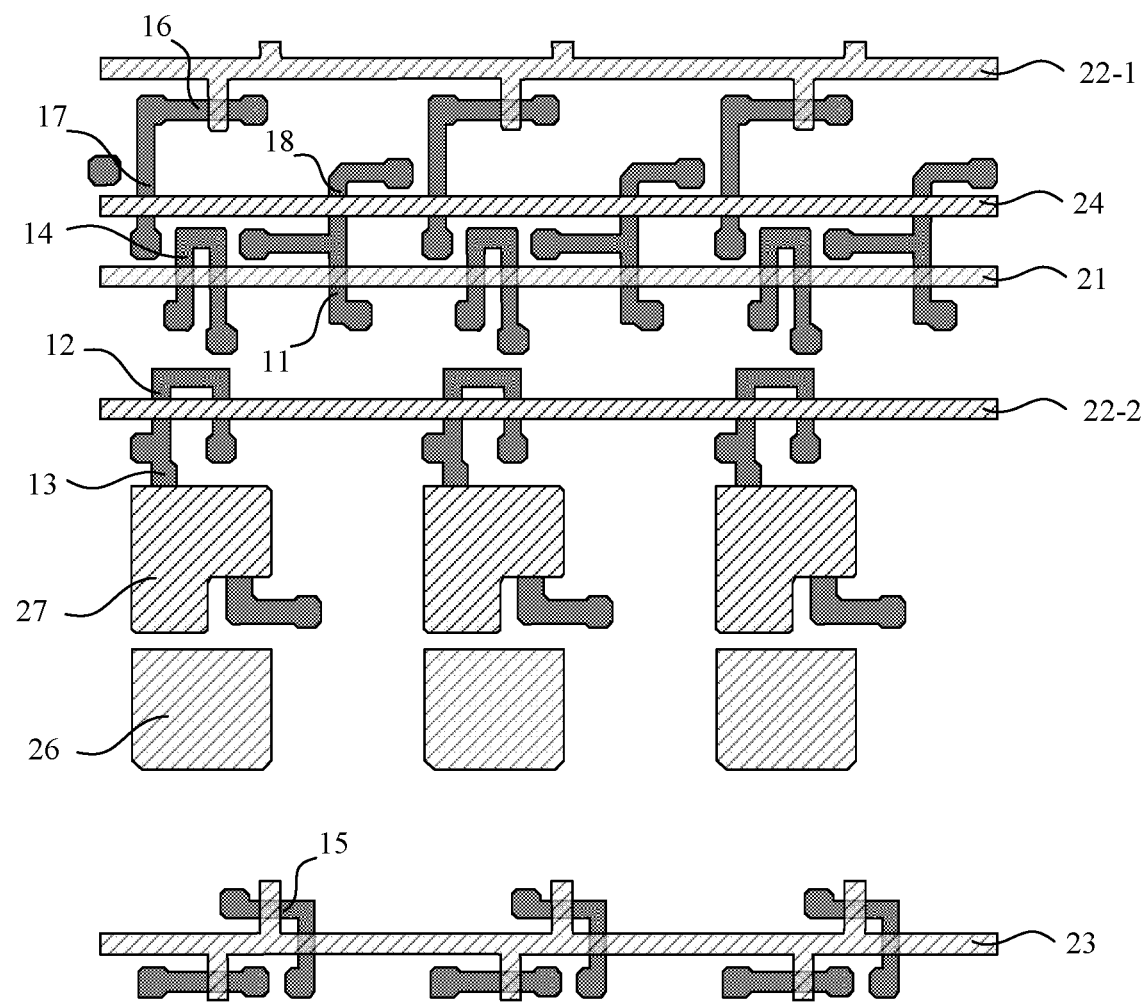
FIG. 8 is a schematic diagram after a pattern of a first conductive layer is formed according to an exemplary embodiment of the present disclosure.

(2) A first conductive layer pattern is formed. In an exemplary embodiment, forming a pattern of a first conductive layer may include: depositing a second insulation thin film and a first metal thin film in sequence on the substrate on which the aforementioned patterns are formed, and patterning the first metal thin film through a patterning process to form a second insulation layer covering the pattern of the semiconductor layer and a pattern of the first conductive layer disposed on the second insulation layer. The pattern of the first conductive layer at least includes a first scan signal line 21, a second scan signal line 22-1, a second scan signal line 22-2, a third scan signal line 23, an emitting control line 24, a first electrode plate 26 of a storage capacitor, and a first electrode plate 27 of a threshold capacitor, as shown in FIG. 8.

In an exemplary embodiment, the first scan signal line 21, the second scan signal line 22-1, the second scan signal line 22-2, the third scan signal line 23, and the emitting control line 24 may extend along a first direction X. The first electrode plate 26 of the storage capacitor and the first electrode plate 27 of the threshold capacitor are disposed at intervals and both disposed between the second scan signal line 22-2 and the third scan signal line 23, the first electrode plate 26 of the storage capacitor is close to the third scan signal line 23, and the first electrode plate 27 of the threshold capacitor is close to the second scan signal line 22-2. The first scan signal line 21 is disposed on a side of the second scan signal line 22-2 away from the first electrode plate 27 of the threshold capacitor, and the emitting control line 24 is disposed on a side of the first scan signal line 21 away from the third scan signal line 23. In an exemplary embodiment, the second scan signal line 22-1 and the second scan signal line 22-2 are connected to a same signal source and output a same signal.

In an exemplary embodiment, an outline of the first electrode plate 26 of the storage capacitor may be rectangular, and corners may be provided with chamfers. An outline of the first electrode plate 27 of the threshold capacitor may be rectangular, corners of the rectangular outline close to a first region of the third active layer 13 are provided with grooves, and the corners may be provided with chamfers.

In an exemplary embodiment, the first scan signal line 21, the second scan signal line 22-1, the second scan signal line 22-2, the third scan signal line 23, and the emitting control line 24 may be arranged with an equal width or with unequal widths, and the width is a dimension in a second direction Y.

In an exemplary embodiment, a plurality of first gate blocks and a plurality of second gate blocks may be disposed on the third scan signal line 23 (which is also a second scan signal line of a sub-pixel in a previous sub-pixel row). Each sub-pixel may be provided with a first gate block and a second gate block. Wherein, one end of the first gate block is connected to the third scan signal line 23 and the other end extends along the second direction Y, and one end of the second gate block is connected to the third scan signal line 23 and the other end extends along an opposite direction of the second direction Y. The first gate block and the second gate block are configured to form double-gate electrodes.

In an exemplary embodiment, a region where the first scan signal line 21 is overlapped with the first active layer 11 is used as a gate electrode of the first transistor T1, a region where the first scan signal line 21 is overlapped with the fourth active layer 14 is used as a gate electrode (double-gate structure) of the fourth transistor T4, a region where the second scan signal line 22-2 is overlapped with the second active layer 12 is used as a gate electrode (double-gate structure) of the second transistor T2, a region where the second scan signal line 22-1 is overlapped with the sixth active layer 16 is used as a gate electrode of the sixth transistor T6, a region where the third scan signal line 23 is overlapped with the fifth active layer 15 is used as a gate electrode (double-gate structure) of the fifth transistor T5, a region where the emitting control line 24 is overlapped with the seventh active layer 17 is used as a gate electrode of the seventh transistor T7, and a region where the emitting control line 24 is overlapped with the eighth active layer 18 is used as a gate electrode of the eighth transistor T8. There is an overlapping region between an orthographic projection of the first electrode plate 27 of the threshold capacitor on the substrate and an orthographic projection of the third active layer 13 on the substrate, and the first electrode plate 27 of the threshold capacitor is simultaneously used as a gate electrode of the third transistor T3.

In an exemplary embodiment, the first transistor T1, the second transistor T2, the fourth transistor T4, the fifth transistor T5, the sixth transistor T6, the seventh transistor T7, and the eighth transistor T8 are all switching transistors, and the third transistor T3 is a driving transistor.

In an exemplary embodiment, there is no overlapping region between an orthographic projection of the first electrode plate 26 of the storage capacitor on the substrate and an orthographic projection of the third active layer on the substrate.

In an exemplary embodiment, the first electrode plate 26 of the storage capacitors of adjacent sub-pixels in a sub-pixel row are arranged in isolation, and the first electrode plates 27 of the threshold capacitors in adjacent sub-pixels are arranged in isolation.

In an exemplary embodiment, after the first conductive layer pattern is formed, the semiconductor layer may be subjected to a conductive treatment by using the first conductive layer as a shield. The semiconductor layer in a region shielded by the first conductive layer forms channel regions of the first transistor T1 to the eighth transistor T8, and the semiconductor layer in a region not shielded by the first conductive layer is made to be conductive, that is, first regions and second regions of the first active layer to the eighth active layer are all made to be conductive.

Figure 9:
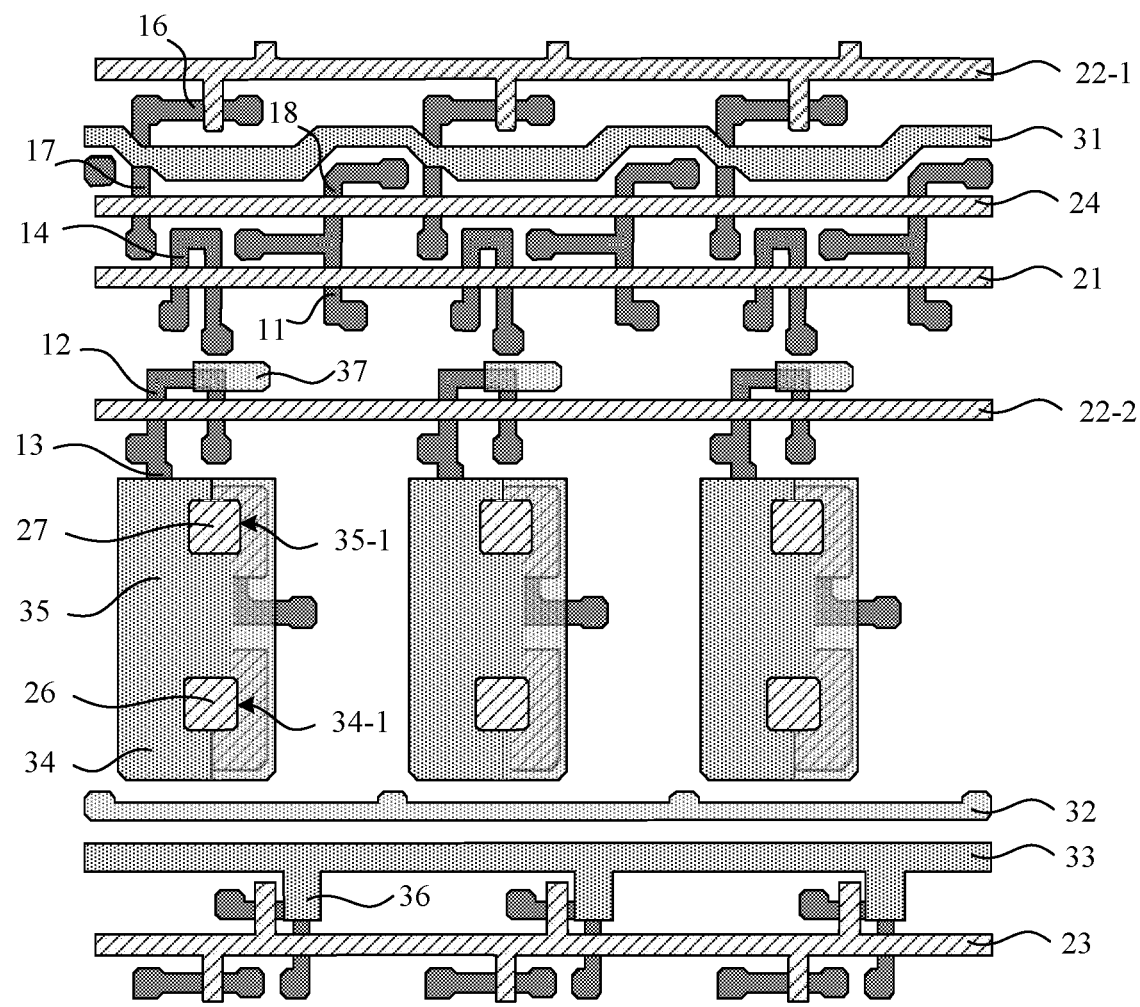
FIG. 9 is a schematic diagram after a pattern of a second conductive layer is formed according to an exemplary embodiment of the present disclosure.

(3) A second conductive layer pattern is formed. In an exemplary embodiment, forming a pattern of a second conductive layer may include: depositing a third insulation thin film and a second metal thin film in sequence on the substrate on which the aforementioned patterns are formed, and patterning the second metal thin film through a patterning process to form a third insulation layer covering the first conductive layer and a pattern of a second conductive layer disposed on the third insulation layer. The pattern of the second conductive layer at least include an initial signal line 31, a reference signal connection line 32, a first power connection line 33, a second electrode plate 34 of a storage capacitor, a second electrode plate 35 of a threshold capacitor, a first electrode plate 36, and a second electrode plate 37, as shown in FIG. 9.

In an exemplary embodiment, the second electrode plate 34 of the storage capacitor and the second electrode plate 35 of the threshold capacitor are disposed between the second scan signal line 22-2 and the third scan signal line 23, and the second electrode plate 34 of the storage capacitor and the second electrode plate 35 of the threshold capacitor may be an integral structure connected to each other.

In an exemplary embodiment, the second electrode plate 34 of the storage capacitor and the second electrode plate 35 of the threshold capacitor of the integral structure may have a rectangular shape, and corners of the rectangular shape may be provided with chamfers.

In an exemplary embodiment, there is an overlapping region between an orthographic projection of the second electrode plate 34 of the storage capacitor on the substrate and an orthographic projection of the first electrode plate 26 of the storage capacitor on the substrate. The second electrode plate 34 of the storage capacitor is provided with a first opening 34-1, which may be rectangular and is located in a middle of the second electrode plate 34 of the storage capacitor. The first opening 34-1 causes the second electrode plate 34 of the storage capacitor to form an annular structure. The first opening 34-1 exposes the third insulation layer covering the first electrode plate 26 of the storage capacitor, and the orthographic projection of the first electrode plate 26 of the storage capacitor on the substrate includes an orthographic projection of the first opening 34-1 on the substrate. In an exemplary embodiment, the first opening 34-1 is configured to accommodate a first via formed subsequently, wherein the first via is located in the first opening 34-1 and exposes the first electrode plate 26 of the storage capacitor, so that a first connection electrode formed subsequently is connected to the first electrode plate 26 of the storage capacitor through the first via.

In an exemplary embodiment, there is an overlapping region between an orthographic projection of the second electrode plate 35 of the threshold capacitor on the substrate and an orthographic projection of the first electrode plate 27 of the threshold capacitor on the substrate. The second electrode plate 35 of the threshold capacitor is provided with a second opening 35-1, which may be rectangular and is located in a middle of the second electrode plate 35 of the threshold capacitor. The second opening 35-1 causes the second electrode plate 35 of the threshold capacitor to form an annular structure. The second opening 35-1 exposes the third insulation layer covering the first electrode plate 27 of the threshold capacitor, and an orthographic projection of the first electrode plate 27 of the threshold capacitor on the substrate includes an orthographic projection of the second opening 35-1 on the substrate. In an exemplary embodiment, the second opening 35-1 is configured to accommodate a second via formed subsequently, wherein the second via is located in the second opening 35-1 and exposes the first electrode plate 27 of the threshold capacitor, so that a second connection electrode formed subsequently is connected to the first electrode plate 27 of the threshold capacitor through the second via.

In an exemplary embodiment, the first electrode plate 26 of the storage capacitor and the second electrode plate of the storage capacitor form a storage capacitor Cst of a pixel drive circuit. The first electrode plate 26 of the storage capacitor is used as a second terminal of the storage capacitor Cst, and the second electrode plate 34 of the storage capacitor is used as a first terminal of the storage capacitor Cst. The first electrode plate 27 of the threshold capacitor and the second electrode plate 35 of the threshold capacitor form a threshold capacitor CVth of the pixel drive circuit. The first electrode plate 27 of the threshold capacitor is used as a first terminal of the threshold capacitor CVth and as a gate electrode of the third transistor T3 simultaneously. The second electrode plate 35 of the threshold capacitor is used as a second terminal of the threshold capacitor. The first terminal of the storage capacitor Cst is connected to a second terminal of the threshold capacitor CVth, and the first terminal of the storage capacitor Cst is simultaneously used as the second terminal of the threshold capacitor CVth.

In an exemplary embodiment, second electrode plates 34 of storage capacitors of adjacent sub-pixels in a sub-pixel row are disposed at intervals, and second electrode plates 35 of threshold capacitors of adjacent sub-pixels in a sub-pixel row are disposed at intervals.

In an exemplary embodiment, an initial signal line 31, a reference signal connection line 32, and a first power connection line 33 extend along a first direction X. The initial signal line 31 is provided on one side of the emitting control line 24 away from the first scan signal line 21, and the reference signal connection line 32 and the first power connection line 33 are disposed between the third scan signal line 23 and the first electrode plate 26 of the storage capacitor. The reference signal connection line 32 is close to the first electrode plate 26 of the storage capacitor, and the first power connection line 33 is close to the third scan signal line 23.

In an exemplary embodiment, the reference signal connection line 32 is configured to be connected to a reference signal line formed subsequently, so that the reference signal connection line 32 in a sub-pixel row is used as a connection line such that each sub-pixel in the sub-pixel row has a same reference voltage, thereby improving display uniformity.

In an exemplary embodiment, the first power connection line 33 is configured to be connected to a first power supply line formed subsequently, so that the first power connection line 33 in a sub-pixel row is used as a connection line, so that each sub-pixel in a sub-pixel row has a same first power supply voltage, thereby improving display uniformity.

In an exemplary embodiment, the initial signal line 31, the reference signal connection line 32, and the first power connection line 33 may be arranged with an equal width or with unequal widths.

In an exemplary embodiment, one end of the first electrode plate 36 is connected to the first power connection line 33, and the other end extends along the second direction Y. And there is an overlapping region between an orthographic projection of the first electrode plate 36 on the substrate and an orthographic projection of the fifth active layer 15 between two gate electrodes of the fifth transistor T5 of a double-gate structure. The first electrode plate 36 is configured to introduce a first parasitic capacitor at a double-gate intermediate node of the fifth transistor T5, and the first parasitic capacitor is used for stabilizing a potential of the double-gate intermediate node of the fifth transistor T5, thereby stabilizing a potential of a second node. In an exemplary embodiment, a size of the first parasitic capacitor may be adjusted by adjusting an area of the overlapping region of the first electrode plate 36 and the fifth active layer 15 between the two gate electrodes of the fifth transistor T5.

In an exemplary embodiment, the area of the overlapping region of the first electrode plate 36 and the fifth active layer 15 between the two gate electrodes of the fifth transistor T5 may be different corresponding to sub-pixels emitting light of different colors.

In an exemplary embodiment, a second electrode plate 37 is disposed between the first scan signal line 21 and the second scan signal line 22-2, and there is an overlapping region between an orthographic projection of the second electrode plate 37 on the substrate and an orthographic projection of the second active layer 12 between two gate electrodes of the second transistor T2 of a double-gate structure on the substrate. The second electrode plate 37 is configured to introduce a second parasitic capacitor at a double-gate intermediate node of the second transistor T2 to stabilize a potential of a first node N1. In an exemplary embodiment, a size of the second parasitic capacitor may be adjusted by adjusting an area of the overlapping region of the second electrode plate 37 and the second active layer 12 between the two gate electrodes of the second transistor T2.

In an exemplary embodiment, the area of the overlapping region between the second electrode plate 37 and the second active layer 12 between the two gate electrodes of the second transistor T2 may be different corresponding to sub-pixels emitting light of different colors.

Figure 10:
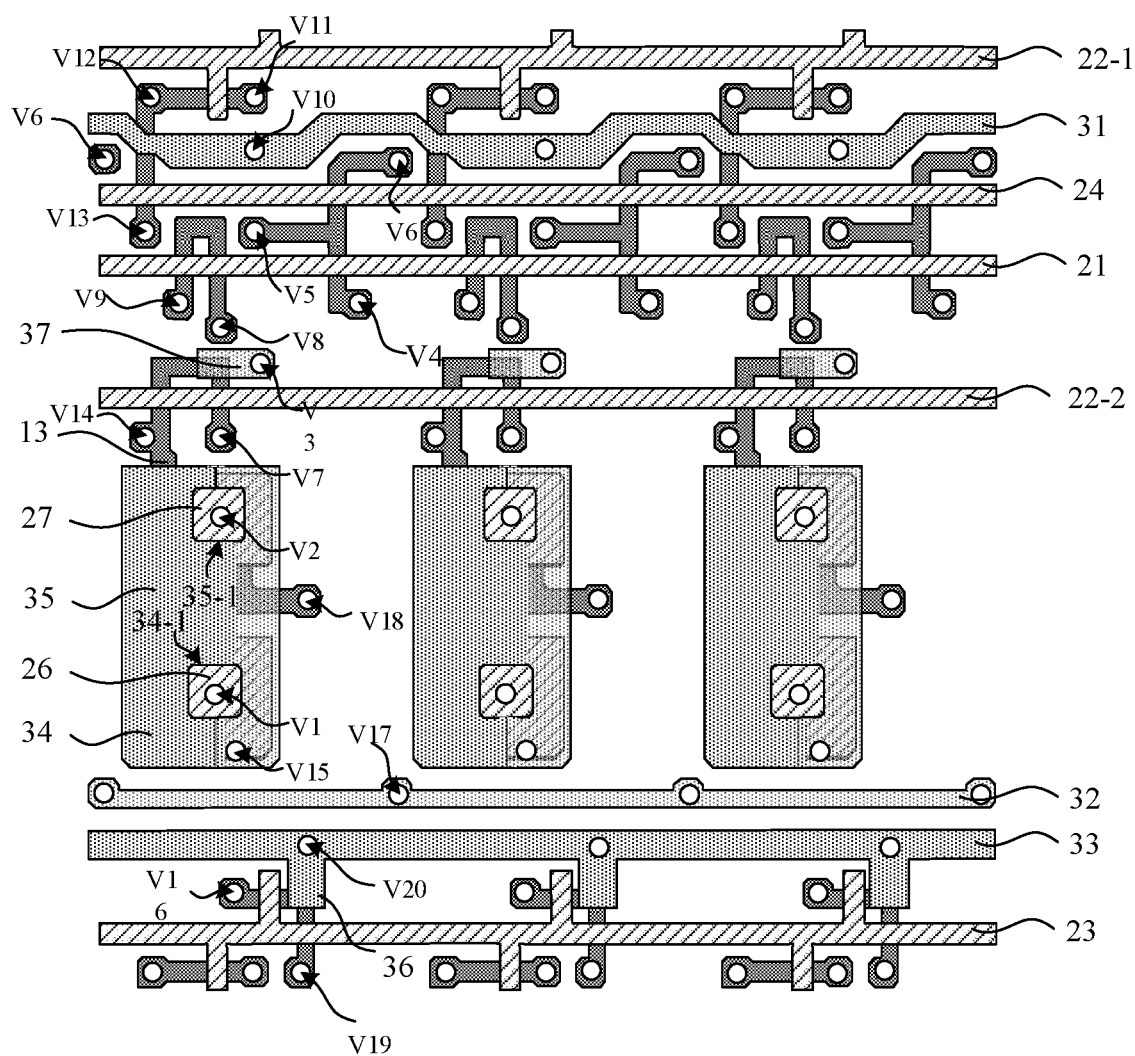
FIG. 10 is a schematic diagram after a pattern of a fourth insulation layer is formed according to an exemplary embodiment of the present disclosure.

(4) A fourth insulation layer pattern is formed. In an exemplary embodiment, forming a pattern of a fourth insulation layer may include: depositing a fourth insulation thin film on the substrate on which the aforementioned patterns are formed, and patterning the fourth insulation thin film through a patterning process to form the fourth insulation layer covering the second conductive layer. The fourth insulation layer is provided with a plurality of vias, which at least include a first via V1, a second via V2, a third via V3, a fourth via V4, a fifth via V5, a sixth via V6, a seventh via V7, an eighth via V8, a ninth via V9, a tenth via V10, an eleventh via V11, a twelfth via V12, a thirteenth via V13, a fourteenth via V14, a fifteenth via V15, a sixteenth via V16, a seventh via V17, an eighteenth via V18, a nineteenth via V19, and a twentieth via V20, as shown in FIG. 10.

In an exemplary embodiment, the first via V1 is located in a region where the first opening 34-1 provided on the second electrode plate 34 of the storage capacitor is located. An orthographic projection of the first via V1 on the substrate is within a range of an orthographic projection of the first opening 34-1 on the substrate. The fourth insulation layer and the third insulation layer in the first via V1 are etched away to expose a surface of the first electrode plate 26 of the storage capacitor. The first via V1 is configured so that a first connection electrode formed subsequently is connected to the first electrode plate 26 of the storage capacitor through this via.

In an exemplary embodiment, the second via V2 is located in a region where the second opening 35-1 provided on the second electrode plate 35 of the threshold capacitor is located. The fourth insulation layer and the third insulation layer in the second via V2 are etched away to expose a surface of the first electrode plate 27 of the threshold capacitor. The second via V2 is configured so that a second connection electrode formed subsequently is connected to the first electrode plate 27 of the threshold capacitor through this via.

In an exemplary embodiment, the third via V3 is located in a region where the second electrode plate 37 is located. The fourth insulation layer in the third via V3 is etched away to expose a surface of the second electrode plate 37. The third via V3 is configured so that a first connection electrode formed subsequently is connected to the second electrode plate 37 through this via.

In an exemplary embodiment, the fourth via V4 is located in a region where the first region of the first active layer is located. The fourth insulation layer, the third insulation layer, and the second insulation layer 62 in the fourth via V4 are etched away to expose a surface of the first region of the first active layer. The fourth via V4 is configured so that a data signal line formed subsequently is connected to the first active layer through this via.

In an exemplary embodiment, the fifth via V5 is located in a region where the second region of the first active layer (which is also the second region of the eighth active layer) is located. The fourth insulation layer, the third insulation layer, and the second insulation layer 62 in the fifth via V5 are etched away to expose a surface of the second region of the first active layer. The fifth via V5 is configured so that a first connection electrode formed subsequently is connected to the first active layer through this via.

In an exemplary embodiment, the sixth via V6 is located in a region where the first region of the eighth active layer is located. The fourth insulation layer, the third insulation layer, and the second insulation layer 62 in the sixth via V6 are etched away to expose a surface of the first region of the eighth active layer. The sixth via V6 is configured so that a reference signal line formed subsequently is connected to the eighth active layer through this via.

In an exemplary embodiment, the seventh via V7 is located in a region where the first region of the second active layer is located. The fourth insulation layer, the third insulation layer, and the second insulation layer 62 in the seventh via V7 are etched away to expose a surface of the first region of the second active layer. The seventh via V7 is configured so that a second connection electrode formed subsequently is connected to the second active layer through this via.

In an exemplary embodiment, the eighth via V8 is located in a region where the second region of the fourth active layer is located. The fourth insulation layer, the third insulation layer, and the second insulation layer 62 in the eighth via V8 are etched away to expose a surface of the second region of the fourth active layer. The eighth via V8 is configured so that a second connection electrode formed subsequently is connected to the fourth active layer through this via.

In an exemplary embodiment, the ninth via V9 is located in a region where the first region of the fourth active layer is located. The fourth insulation layer, the third insulation layer, and the second insulation layer 62 in the ninth via V9 are etched away to expose a surface of the first region of the fourth active layer. The ninth via V9 is configured so that a third connection electrode formed subsequently is connected to the fourth active layer through this via.

In an exemplary embodiment, the tenth via V10 is located in a region where the initial signal line 31 is located. The fourth insulation layer in the tenth via V10 is etched away to expose a surface of the initial signal line 31. The tenth via V10 is configured so that a third connection electrode formed subsequently is connected to the initial signal line 31 through this via.

In an exemplary embodiment, the eleventh via V11 is located in a region where the first region of the sixth active layer is located. The fourth insulation layer, the third insulation layer, and the second insulation layer 62 in the eleventh via V11 are etched away to expose a surface of the first region of the sixth active layer. The eleventh via V11 is configured so that a third connection electrode formed subsequently is connected to the sixth active layer through this via.

In an exemplary embodiment, the twelfth via V12 is located in a region where the second region of the sixth active layer (which is also the second region of the seventh active layer) is located. The fourth insulation layer, the third insulation layer, and the second insulation layer 62 in the twelfth via V12 are etched away to expose a surface of the second region of the sixth active layer. The twelfth via V12 is configured so that a fourth connection electrode formed subsequently is connected to the sixth active layer through this via.

In an exemplary embodiment, the thirteenth via V13 is located in a region where the first region of the seventh active layer is located. The fourth insulation layer, the third insulation layer, and the second insulation layer 62 in the thirteenth via V13 are etched away to expose a surface of the first region of the seventh active layer. The thirteenth via V13 is configured so that a fifth connection electrode formed subsequently is connected to the seventh active layer through this via.

In an exemplary embodiment, the fourteenth via V14 is located in a region where the second region of the second active layer (which is also the second region of the third active layer) is located. The fourth insulation layer, the third insulation layer, and the second insulation layer 62 in the fourteenth via V14 are etched away to expose a surface of the second region of the second active layer. The fourteenth via V14 is configured so that a fifth connection electrode formed subsequently is connected to the second active layer through this via.

In an exemplary embodiment, the fifteenth via V15 is located in a region where the second electrode plate 34 of the storage capacitor is located. The fourth insulation layer in the fifteenth via V15 is etched away to expose a surface of the second electrode plate 34 of the storage capacitor. The fifteenth via V15 is configured so that a sixth connection electrode formed subsequently is connected to the second electrode plate 34 of the storage capacitor through this via.

In an exemplary embodiment, the sixteenth via V16 is located in a region where the second region of the fifth active layer is located. The fourth insulation layer, the third insulation layer, and the second insulation layer 62 in the sixteenth via V16 are etched away to expose a surface of the second region of the fifth active layer. The sixteenth via V16 is configured so that a sixth connection electrode formed subsequently is connected to the fifth active layer through this via.

In an exemplary embodiment, the seventeenth via V17 is located in a region where the reference signal connection line 32 is located. The fourth insulation layer in the seventeenth via V17 is etched away to expose a surface of the reference signal connection line 32. The seventeenth via V17 is configured so that a reference signal line formed subsequently is connected to the reference signal connection line 32 through this via.

In an exemplary embodiment, the eighteenth via V18 is located in a region where the first region of the third active layer is located. The fourth insulation layer, the third insulation layer, and the second insulation layer 62 in the eighteenth via V18 are etched away to expose a surface of the first region of the third active layer. The eighteenth via V18 is configured so that a first power supply line formed subsequently is connected to the third active layer through this via.

In an exemplary embodiment, the nineteenth via V19 is located in a region where the first region of the fifth active layer is located. The fourth insulation layer, the third insulation layer, and the second insulation layer 62 in the nineteenth via V19 are etched away to expose a surface of the first region of the fifth active layer. The nineteenth via V19 is configured so that a first power supply line formed subsequently is connected to the fifth active layer through this via.

In an exemplary embodiment, the twentieth via V20 is located in a region where the first power connection line 33 is located. The fourth insulation layer in the twentieth via V20 is etched away to expose a surface of the first power connection line 33. The twentieth via V20 is configured so that a first power supply line 71 formed subsequently is connected to the first power connection line 33 through this via.

Figure 11:
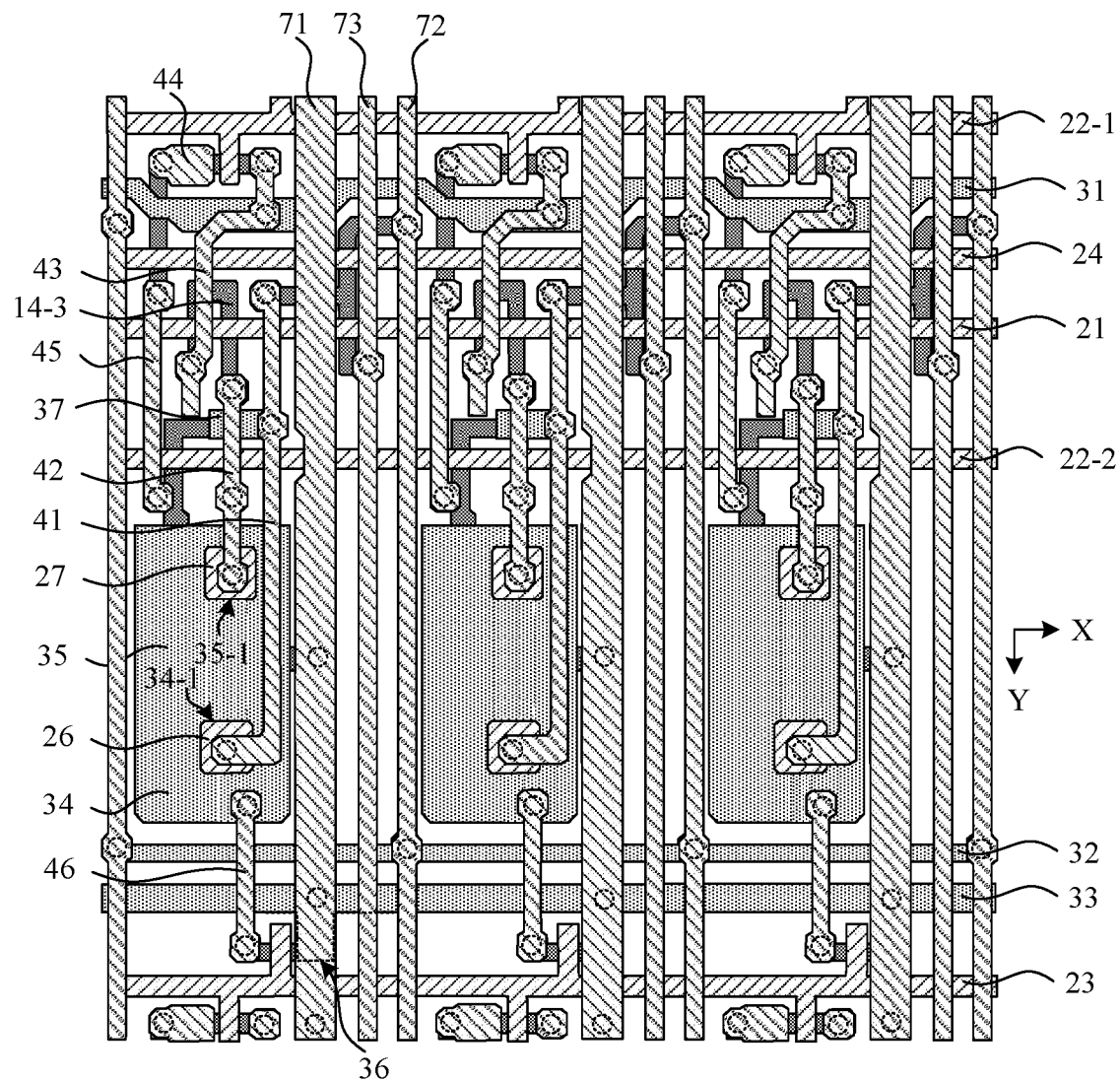
FIG. 11 is a schematic diagram after a pattern of a third conductive layer is formed according to an exemplary embodiment of the present disclosure.

(5) A third conductive layer pattern is formed. In an exemplary embodiment, forming a pattern of a third conductive layer may include: depositing a third metal thin film on the substrate on which the aforementioned patterns are formed, patterning the third metal thin film through a patterning process to form a third conductive layer disposed on the fourth insulation layer, wherein the third conductive layer at least includes: a first connection electrode 41, a second connection electrode 42, a third connection electrode 43, a fourth connection electrode 44, a fifth connection electrode 45, a sixth connection electrode 46, a first power supply line 71, a reference signal line 72, and a data signal line 73, as shown in FIG. 11.

In the exemplary embodiment, the first power supply line 71, the reference signal line 72, and the data signal line 73 extend along the second direction Y, and the first power supply line 71, the reference signal line 72, and the data signal line 73 may be arranged with an equal width or with an equal width, may be straight lines or folded lines.

In the exemplary embodiment, the first power supply line 71 is connected to the first region of the third active layer through the eighteenth via V18, connected to the first region of the fifth active layer through the nineteenth via V19, and connected to the first power connection line 33 through the twentieth via V20. The first power supply line 71 extending along the second direction Y is connected to the first power connection line 33 extending along the first direction X, so that a plurality of sub-pixels of a sub-pixel row have a same first power supply voltage, thereby improving display uniformity.

In an exemplary embodiment, the reference signal line 72 is connected to the first region of the eighth active layer through the sixth via V6 and connected to the reference signal connection line 32 through the seventeenth via V17. The reference signal line 72 extending along the second direction Y is connected to the reference signal connection line 32 extending along the first direction X, so that a plurality of sub-pixels of a sub-pixel row have a same reference voltage, thereby improving display uniformity.

In an exemplary embodiment, the data signal line 73 is connected to the first region of the first active layer through the fourth via V4.

In an exemplary embodiment, the first connection electrode 41 is in a shape of a straight line extending along the second direction Y, one end of which is connected to the first electrode plate 26 of the storage capacitor through the first via V1, and the other end of which is connected to the second region of the first active layer (which is also the second region of the eighth active layer) through the fifth via V5. A middle position between the two ends is connected to the second electrode plate 37 through the third via V3. The first connection electrode 41 is simultaneously used as the second electrode of the first transistor T1 and the second electrode of the eighth transistor T8, and has a same potential as the second terminal of the storage capacitor Cst (i.e. a third node N3).

In an exemplary embodiment, since the second electrode plate 37 is provided at a node between two gate electrodes of the second transistor T2 of a double-gate structure, while the second electrode plate 37 has a same potential as a third node N3, an overlapping second parasitic capacitor is formed between the second active layer between the two gate electrodes, and the second electrode plate 37 having the potential of the third node N3, wherein the second parasitic capacitor is used for stabilizing the potential of the first node N1.

In an exemplary embodiment, the first connection electrode 41 is configured to introduce a third parasitic capacitor at a double-gate intermediate node of the fourth transistor T4 of a double-gate structure. The first connection electrode 41 extends along the second direction Y, a third region 14-3 of the fourth active layer between two gate electrodes of the fourth transistor T4 also extends along the second direction Y. The first connection electrode 41 is located on a side of the first power supply line 71 in an opposite direction of the first direction X, the fourth active layer of the fourth transistor T4 is located on a side of the first connection electrode 41 in an opposite direction of the first direction X, and the first connection electrode 41 is adjacent to the third region 14-3. There is an overlapping region between an orthographic projection of the third region 14-3 of the fourth active layer on the first power supply line 71 and an orthographic projection of the first connection electrode 41 on the first power supply line 71. That is, there is an overlapping region between an orthographic projection of the first connection electrode 41 along the first direction X on the first power supply line 71 and an orthographic projection of the fourth active layer located between two fourth gate electrodes along the first direction X on the first power supply line 71. Thus a third parasitic capacitor is laterally formed between the first connection electrode 41 and the third region 14-3 of the fourth active layer, and the third parasitic capacitor is used for stabilizing the potential of the first node N1.

In an exemplary embodiment, the second connection electrode 42 is in a shape of a straight line extending along the second direction Y, one end of which is connected to the first electrode plate 27 of the threshold capacitor through the second via V2, and the other end of which is connected to the second region of the fourth active layer through the eighth via V8. A middle position between the two ends is connected to the first region of the second active layer through the seventh via V7. The second connection electrode 42 is simultaneously used as both the first electrode of the second transistor T2 and the second electrode of the fourth transistor T4, and has a same potential as the first terminal of the threshold capacitor CVth (i.e. a first node N1). Since the first electrode plate 27 of the threshold capacitor is simultaneously used as the gate electrode of the third transistor T3, the second connection electrode 42 achieves mutual connections of the first electrode of the second transistor T2, the gate electrode of the third transistor T3, the second electrode of the fourth transistor T4, and the first electrode plate 27 of the threshold capacitor.

In an exemplary embodiment, the third connection electrode 43 is in a shape of a folded line extending along the second direction Y, one end of which is connected to the first region of the fourth active layer through the ninth via V9, and the other end of which is connected to the first region of the sixth active layer through the eleventh via V11. A middle position between the two ends is connected to the initial signal line 31 through the tenth via V10. The third connection electrode 43 is simultaneously used as the first electrode of the fourth transistor T4 and the first electrode of the sixth transistor T6, so that the first electrode of the fourth transistor T4 and the first pole of the sixth transistor T6 are simultaneously connected to the initial signal line 31. In an exemplary embodiment, there is an overlapping region between an orthographic projection of the third connection electrode 43 on the substrate and an orthographic projection of the fourth active layer between two gate electrodes of the fourth transistor T4 on the substrate.

In an exemplary embodiment, the fourth connection electrode 44 is in a shape of a block, and is connected to the second region of the sixth active layer (which is also the second region of the seventh active layer) through the twelfth via V12. The fourth connection electrode 44 is simultaneously used as the second electrode of the sixth transistor T6 and the second electrode of the seventh transistor T7, so that the second electrode of the sixth transistor T6 and the second electrode of the seventh transistor T7 are connected.

In an exemplary embodiment, the fifth connection electrode 45 is in a shape of a straight line extending along the second direction Y, one end of which is connected to the first region of the seventh active layer through the thirteenth via V13, and the other end of which is connected to the second region of the second active layer (which is also the second region of the third active layer) through the fourteenth via V14. The fifth connection electrode 45 is simultaneously used as the second electrode of the second transistor T2, the second electrode of the third transistor T3, and the first electrode of the seventh transistor T7, so that the second electrode of the second transistor T2, the second electrode of the third transistor T3 and the first electrode of the seventh transistor T7 have a same potential (i.e., a first node N4).

In the exemplary embodiment, the sixth connection electrode 46 is in a shape of a straight line extending along the second direction Y, one end of which is connected to the second electrode plate 34 of the storage capacitor through the fifteenth via V15, and the other end of which is connected to the second region of the fifth active layer through the sixteenth via V16. The sixth connection electrode 46 is used as the second electrode of the fifth transistor T5. Since the sixth connection electrode 46 is connected to the second electrode plate 34 of the storage capacitor, the second electrode plate 34 of the storage capacitor and the second electrode plate 35 of the threshold capacitor are an integral structure connected to each other, thereby it is achieved that the second electrode of the fifth transistor T5, the first terminal of the storage capacitor Cst, and the second terminal of the threshold capacitor CVth have a same potential (i.e., a second node N2).

In the exemplary embodiment, since the first power supply line 71 is connected to the first power connection line 33 and the first power connection line 33 is connected to the first electrode plate 36, the first electrode plate 36 has a same potential as the first power supply line 71. Since there is an overlapping region between an orthographic projection of the first electrode plate 36 on the substrate and an orthographic projection of the fifth active layer 15 between the two gate electrodes of the fifth transistor T5 of the double-gate structure on the substrate, an overlapping first parasitic capacitor is formed between the fifth active layer between the two gate electrodes, and the first electrode plate 36 having a first power supply voltage. The first parasitic capacitor is used for stabilizing a potential of a double gate intermediate node of the fifth transistor T5, which further stabilizes a potential of the second node.

Figure 12:
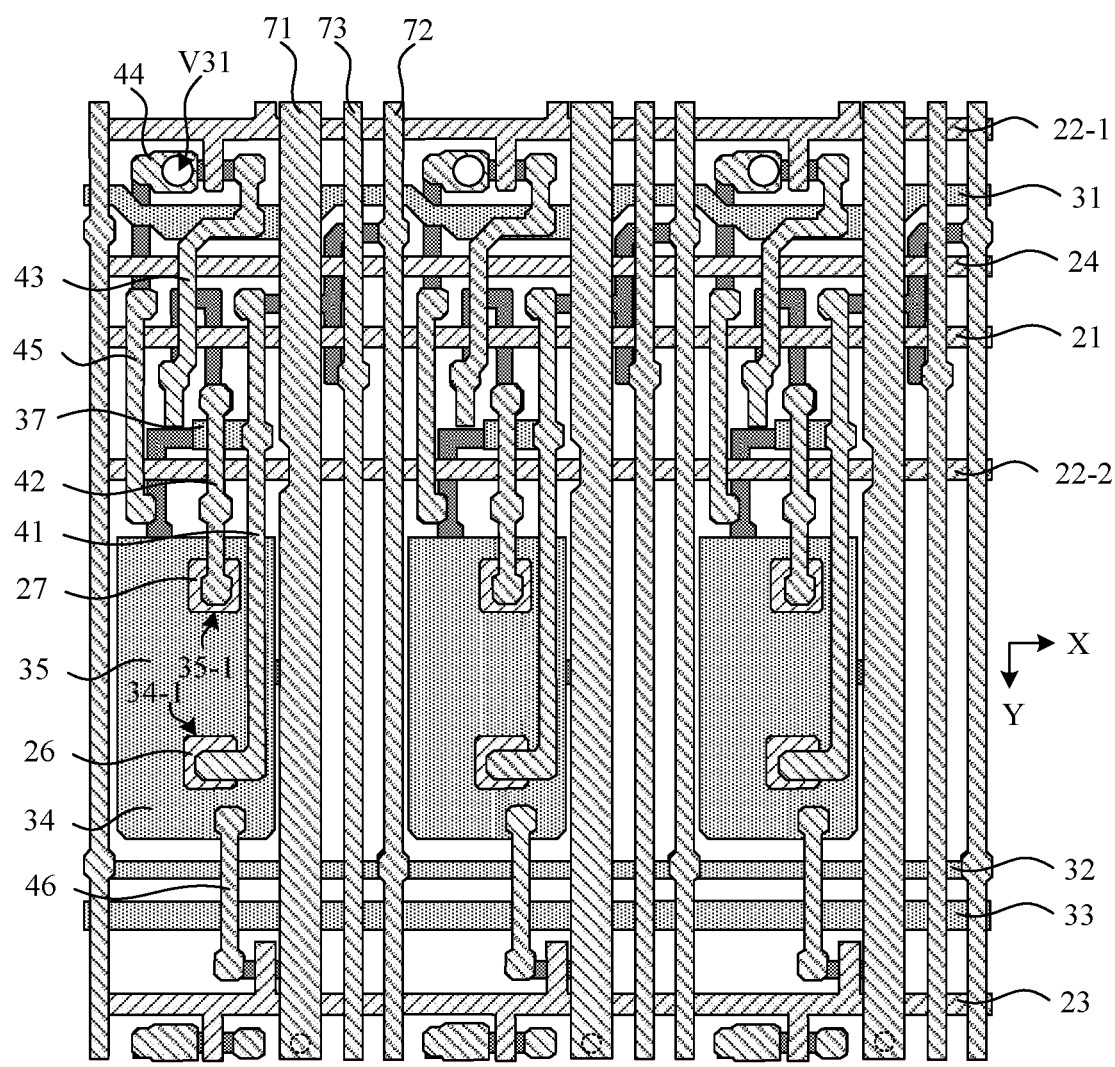
FIG. 12 is a schematic diagram after a pattern of a fifth insulation layer is formed according to an exemplary embodiment of the present disclosure.

(6) A pattern of a fifth insulation layer is formed. In an exemplary embodiment, forming the pattern of the fifth insulation layer may include: coating a fifth insulation thin film on the substrate on which the aforementioned patterns are formed, and patterning the fifth insulation thin film through a patterning process to form the fifth insulation layer covering the third conductive layer. The fifth insulation layer is provided with a plurality of vias, which at least include a thirty-first via V31, as shown in FIG. 12.

In an exemplary embodiment, the thirty-first via V31 is located in a region where the fourth connection electrode 44 is located, the fifth insulation layer in the thirty-first via V31 is removed to expose a surface of the fourth connection electrode 44, and the thirty-first via V11 is configured such that an anode of a light emitting device formed subsequently is connected to the fourth connection electrode 44 through the via.

Figure 13:
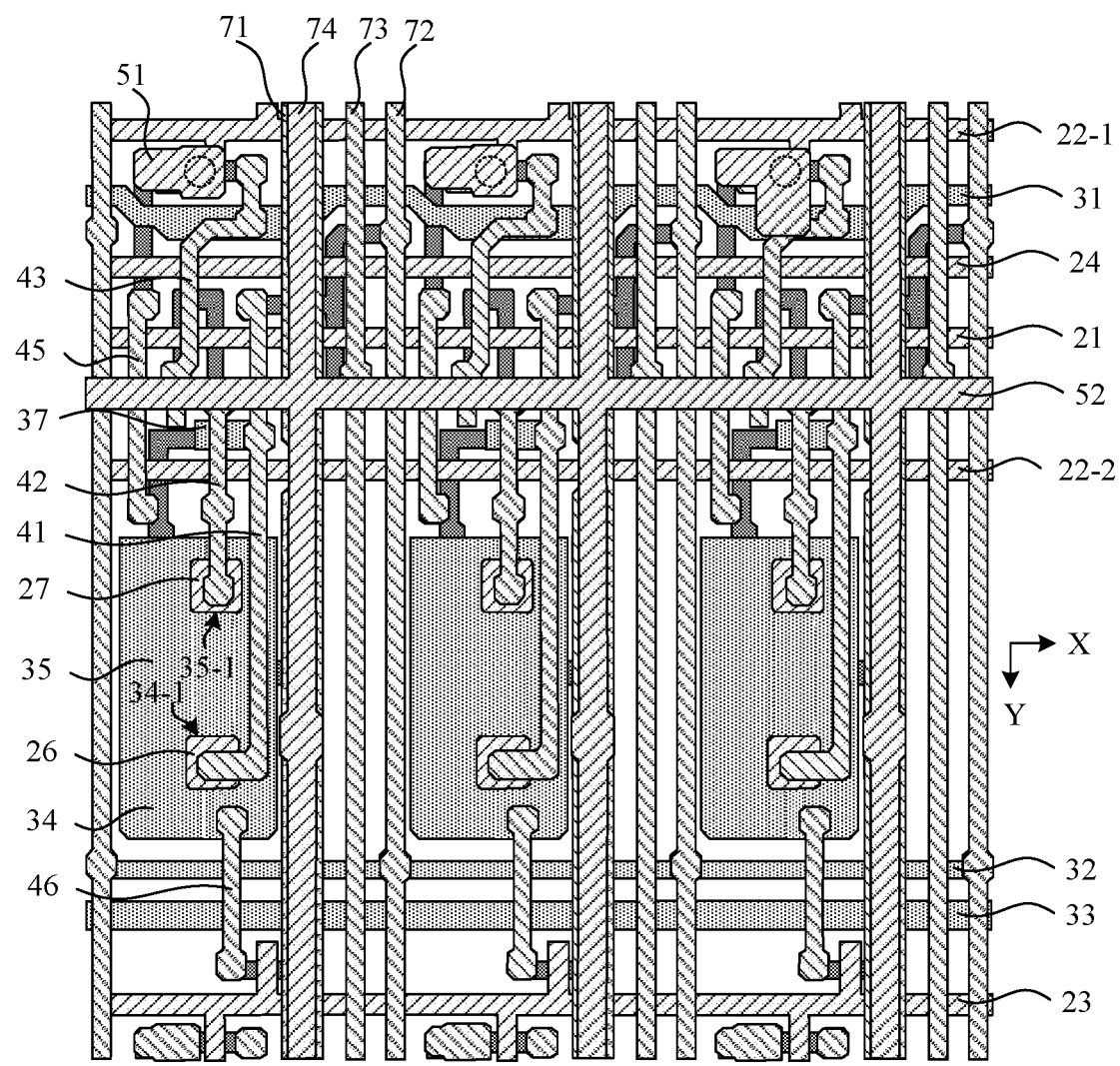
FIG. 13 is a schematic diagram after a pattern of a fourth conductive layer is formed according to an exemplary embodiment of the present disclosure.

(7) A pattern of a fourth conductive layer is formed. In an exemplary embodiment, forming the pattern of the fourth conductive layer may include: depositing a fourth metal thin film on the substrate on which the aforementioned patterns are formed, patterning the fourth metal thin film through a patterning process to form the fourth conductive layer disposed on the fifth insulation layer, wherein the fourth conductive layer at least includes an anode connection electrode 51, a second power connection line 52, and a second power supply line 74, as shown in FIG. 13.

In an exemplary embodiment, the anode connection electrode 51 is provided on one side of the initial signal line 31 away from a first emitting signal line. The anode connection electrode 51 is in a rectangular shape and is connected to the fourth connection electrode 44 through the thirty-first via V31, and the anode connection electrode 51 is configured to connect to the anode of the light emitting device formed subsequently. Since the fourth connection electrode 44 is simultaneously used as the second electrode of the sixth transistor T6 and the second electrode of the seventh transistor T7, a connection between the anode of the light emitting device and the pixel drive circuit is achieved, such that the pixel drive circuit may drive the light emitting device to emit light.

In an exemplary embodiment, the second power supply line 74 extends along the second direction Y and is corresponding to a position of the first power supply line 71. A second power connection line 52 extends along the first direction X and is provided between the first scan signal line 21 and the second scan signal line 22-2, and is connected to the second power supply line 74. Since the second power connection line 52 is connected to the second power supply line 74, the second power connection line 52 in a sub-pixel row is used as a low voltage signal connection line, so that each sub-pixel in the sub-pixel row has a same second power supply voltage, and display uniformity is improved.

In an exemplary embodiment, second power supply lines 74 may be arranged with an equal width or with unequal widths, and may be straight lines or folded lines.

In an exemplary embodiment, a subsequent preparation process may include: forming a planarization layer covering the pattern of the fourth conductive layer, forming the anode of the light emitting device on the planarization layer, forming a pixel define layer covering the anode, wherein a pixel define layer of each sub-pixel is provided with a pixel opening exposing the anode. Subsequently, an organic light emitting layer is formed by using an evaporation process, and a cathode is formed on the organic light emitting layer. Then, an encapsulation layer is formed. The encapsulation layer may include a first encapsulation layer, a second encapsulation layer, and a third encapsulation layer that are stacked. The first encapsulation layer and the third encapsulation layer may be made of an inorganic material. The second encapsulation layer may be made of an organic material. The second encapsulation layer is arranged between the first encapsulation layer and the third encapsulation layer to ensure external water vapor cannot enter the light emitting device.

In an exemplary embodiment, the substrate may be a flexible substrate, or may be a rigid substrate. A rigid substrate may be, but is not limited to, one or more of glass and quartz. A flexible substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary embodiment, the flexible substrate may include a first flexible material layer, a first inorganic material layer, a second flexible material layer, and a second inorganic material layer that are stacked. The first flexible material layer and the second flexible material layer may be made of materials such as polyimide (PI), polyethylene terephthalate (PET), or a polymer soft film which is processed through a surface treatment, and the first inorganic material layer and the second inorganic material layer may be made of silicon nitride (SiNx) or silicon oxide (SiOx), for improving water and oxygen resistance of the substrate. In an exemplary embodiment, a thickness of the first flexible material layer may be about 5 to 15 μm, e.g., 10 μm; a thickness of the second flexible material layer may be about 5 to 15 μm, e.g., 10 μm; a thickness of the first inorganic material layer may be about 0.3 to 0.9 μm, e.g., 0.6 μm; and a thickness of the second inorganic material layer may be about 0.3 to 0.9 μm, e.g., 0.6 μm.

In an exemplary embodiment, the first conductive layer, the second conductive layer, the third conductive layer, and the fourth conductive layer may be made of metal materials, such as any one or more of silver (Ag), copper (Cu), aluminum (Al), and molybdenum (Mo), or alloy materials of the above metals, such as aluminum neodymium alloy (AlNd) or molybdenum niobium alloy (MoNb), and may be a single-layer structure or a multi-layer composite structure, such as Mo/Cu/Mo. The first conductive layer is referred to as a first gate metal (Gate1) layer, the second conductive layer is referred to as a second gate metal (Gate2) layer, the third conductive layer is referred to as a first source-drain metal (SD1) layer, and the fourth conductive layer is referred to as a second source-drain metal (SD1) layer. The first insulation layer, the second insulation layer, the third insulation layer, the fourth insulation layer, and the fifth insulation layer may be made of any one or more of silicon oxide (SiOx), silicon nitride (SiNx), and silicon oxynitride (SiON), and may be a single layer, a multilayer, or a composite layer. The first insulation layer is called a Buffer layer to improve a water and oxygen resistance capability of the substrate, the second insulation layer and third insulation layer are called gate insulation (GI) layers, the fourth insulation layer is called an interlayer dielectric (ILD) layer, and the fifth insulation layer is called a passivation (PVX) layer. The semiconductor layer may be made of materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene. That is, the present disclosure is applicable to transistors that are manufactured based on an oxide technology, a silicon technology, or an organic technology.

In an exemplary embodiment, a thickness of the first insulation layer is 3000 to 5000 angstroms, a thickness of the second insulation layer is 1000 to 2000 angstroms, a thickness of the third insulation layer is 4500 to 7000 angstroms, a thickness of the fourth insulation layer is 3000 to 5000 angstroms, and a thickness of the fifth insulation layer is 3000 to 5000 angstroms.

High-resolution (Pixels Per Inch (PPI)) display with finer picture quality and display quality has become a design trend. Since a pixel area of high-resolution display is small, various interference factors need to be considered for an arrangement of a pixel drive circuit in a limited space, especially an influence of a data signal line on a key node in the pixel drive circuit. In the pixel drive circuit shown in FIG. 4, in an emitting stage, the third node N3 is stabilized at a potential of a reference voltage supplied by a reference signal line through the eighth transistor T8. Since the second transistor T2, the fourth transistor T4, and the fifth transistor T5 are disconnected, a leakage path of the second node N2 is a single leakage path of the fifth transistor T5, and a leakage path of the first node N1 is a double leakage path of the second transistor T2 and the fourth transistor T4 during the emitting stage. In a pixel drive circuit of a display substrate, in order to reduce leakage of a key node during an emitting stage, a double-gate structure is adopted for all of a second transistor T2, a fourth transistor T4, and a fifth transistor T5, but this solution has a problem of poor potential stability of a first node N1 and a second node N2.

Figure 14:
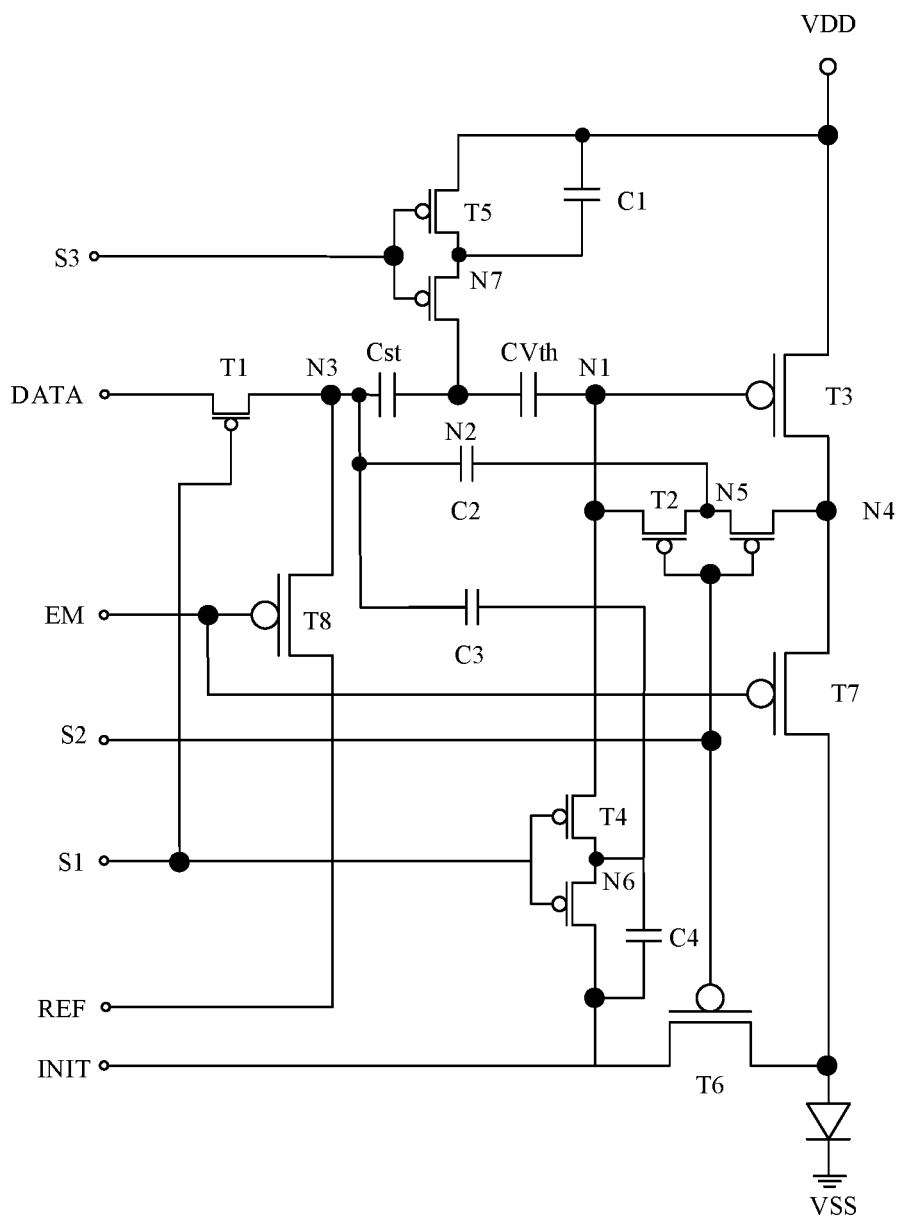
FIG. 14 is an equivalent circuit diagram of a pixel drive circuit according to an exemplary embodiment of the present disclosure.

Studies show that a double-gate intermediate node of a double-gate transistor is suspended, and there is a gate-source capacitor (Cgs) and a gate-drain capacitor (Cgd). When a gate voltage jumps from a low voltage to a high voltage, the intermediate node is coupled to a high voltage state, which causes reverse leakage of the transistor, and then affects potentials of a first node N1 and a second node N2. In an exemplary embodiment of the present disclosure, it is proposed that a parasitic capacitor is disposed at a double-gate intermediate node of a double-gate transistor to effectively stabilize potentials of the first node N1 and the second node N2. FIG. 14 is an equivalent circuit diagram of a pixel drive circuit according to an exemplary embodiment of the present disclosure. As shown in FIG. 14, in an exemplary embodiment, a double gate intermediate node N7 of a fifth transistor T5 is provided with a first parasitic capacitor C1, which is an overlapping capacitor formed by a fifth active layer located between two fifth gate electrodes of the fifth transistor T5 and a first electrode plate 36 having a same potential as a first power supply line. A double-gate intermediate node N5 of a second transistor T2 is provided with a second parasitic capacitor C2, which is an overlapping capacitor formed by a second active layer located between two second gate electrodes of the second transistor T2 and a second electrode plate 37 having a same potential as a third node N3. A double-gate intermediate node N6 of a fourth transistor T4 is provided with a third parasitic capacitor C3 which is a lateral capacitor formed by a fourth active layer of the fourth transistor T4 located between two fourth gate electrodes and a first connection electrode 41 having a same potential as the third node N3. The double-gate intermediate node N6 of the fourth transistor T4 is further provided with a fourth parasitic capacitor C4 which is an overlapping capacitor formed by the fourth active layer of the fourth transistor T4 located between the two fourth gate electrodes and a third connection electrode 43 having a same potential as an initial signal line 31.

In an exemplary embodiment, for a single leakage channel of the second node N2 in an emitting stage, since one electrode plate of the first parasitic capacitor C1 is connected to the double-gate intermediate node N7 of the fifth transistor T5, and the other electrode plate is connected to the first power supply line VDD, the double-gate intermediate node N7 of the fifth transistor T5 is prevented from jumping up due to turn-off of a third scan line S3, reverse leakage is eliminated, and a potential of the second node N2 is effectively stabilized.

In an exemplary embodiment, for a double leakage channel of the first node N1 in an emitting stage, since one electrode plate of the second parasitic capacitor C2 is connected to the double-gate intermediate node N5 of the second transistor T2, the other electrode plate is connected to the third node N3, one electrode plate of the third parasitic capacitor C3 is connected to the double-gate intermediate node N6 of the fourth transistor T4, and the other electrode plate is connected to the third node N3, so that when a data voltage Vdt is coupled to the first node N1, the double-gate intermediate node N5 of the second transistor T2 and the double-gate intermediate node N6 of the fourth transistor T4 jump synchronously. When the third node N3 is stabilized at a reference voltage Vref, Vref-Vdt information is synchronously superimposed on the first node N1, the double-gate intermediate node N5, and the double-gate intermediate node N6, so that potentials of the double-gate intermediate node N5 and the double-gate intermediate node N6 approach a potential of the first node N1, thereby reducing leakage of the second transistor T2 and the fourth transistor T4 and effectively stabilizing the potential of the first node N1.

In an exemplary embodiment, capacitor values of the first parasitic capacitor C1, the second parasitic capacitor C2, the third parasitic capacitor C3, and the fourth parasitic capacitor C4 may be designed according to an actual circuit so as to stabilize a potential of a key node. In an exemplary embodiment, a size of a parasitic capacitor may be adjusted by adjusting an area of an overlapping region of an electrode plate and an active layer, and the first parasitic capacitor C1, the second parasitic capacitor C2, the third parasitic capacitor C3, and the fourth parasitic capacitor C4 may be different corresponding to sub-pixels emitting light of different colors. For example, the capacitor values of the first parasitic capacitor C1, the second parasitic capacitor C2, the third parasitic capacitor C3, and the fourth parasitic capacitor C4 may be about 0.1 fF to 6.0 fF.

As may be seen from the structure and preparation process of the display substrate described above, according to the display substrate of the exemplary embodiment of the present disclosure, by introducing a parasitic capacitor at a double-gate intermediate node of a double-gate transistor, an instantaneous high voltage of the double-gate intermediate node is avoided, reverse leakage of the double-gate intermediate node is eliminated, a potential of a key node is effectively stabilized, accuracy of a driving current is ensured, and a display effect is improved. The preparation process in the present disclosure may be compatible well with an existing preparation process, and the process is simple to achieve, easy to implement, high in a production efficiency, low in a production cost, and high in a yield.

The structure shown in the present disclosure and the preparation process thereof are merely an exemplary illustration. In an exemplary embodiment, a corresponding structure may be altered and a patterning process may be added or reduced according to actual needs. In an exemplary embodiment, a first electrode plate and a second electrode plate may be disposed on other conductive layers. For example, the first electrode plate and the second electrode plate may be disposed on a first conductive layer, arranged in a same layer as a first electrode plate of a storage capacitor and a first electrode plate of a threshold capacitor, and are formed simultaneously through a same patterning process. Shapes of the first electrode plate and the second electrode plate may be the same as those of the foregoing exemplary embodiments. As another example, the first electrode plate and the second electrode plate may be disposed on a third conductive layer, arranged in a same layer as a first connection electrode and a first power supply line, and are formed simultaneously through a same patterning process. The shapes of the first electrode plate and the second electrode plate and structures of corresponding connection electrodes may be changed according to actual needs, which is not limited in the present disclosure herein.

In an exemplary embodiment, the display substrate of the present disclosure may be applied to a display apparatus having a pixel drive circuit, such as an OLED, a Quantum Dot display (such as QLED), a Light Emitting Diode display (such as Micro LED or Mini LED), or a Quantum Dot Light Emitting Diode display (such as QDLED), which is not limited in the present disclosure herein.

An exemplary embodiment of the present disclosure provides a preparation method of a display substrate for preparing the display substrate of the above-mentioned exemplary embodiments. In an exemplary embodiment, the display substrate may include a substrate and a plurality of sub-pixels, at least one sub-pixel includes a pixel drive circuit and a light emitting device connected to the pixel drive circuit, the pixel drive circuit includes a plurality of transistors, wherein at least one transistor includes an active layer and two gate electrodes. The preparation method includes: forming a semiconductor layer on the substrate and a plurality of conductive layers disposed on one side of the semiconductor layer away from the substrate, wherein at least one conductive layer is provided with at least one electrode plate, and there is an overlapping region between an orthographic projection of the electrode plate on the substrate and an orthographic projection of the active layer between the two gate electrodes on the substrate.

In an exemplary embodiment, the forming the semiconductor layer on the substrate and a plurality of conductive layers disposed on one side of the semiconductor layer away from the substrate may include: forming a semiconductor layer on the substrate; and sequentially forming a first conductive layer, a second conductive layer, and a third conductive layer on the semiconductor layer, wherein the electrode plate is on the first conductive layer, the second conductive layer, or the third conductive layer.

In an exemplary embodiment, at least one conductive layer is provided with a first power supply line connected to the pixel drive circuit, and at least one electrode plate is connected to the first power supply line.

The present disclosure further provides a display apparatus, which includes the abovementioned display substrate. The display apparatus may be any product or component having a display function, such as a cellphone, a tablet computer, a television, a display, a laptop, a digital photo frame, and a navigator, which is not limited in the embodiments of the present invention.

Although the embodiments disclosed in the present disclosure are as above, the described contents are only embodiments used for facilitating understanding of the present disclosure and are not intended to limit the present invention. Those skilled in the art may make any modification and variation in forms and details of implementations without departing from the spirit and scope disclosed by the present disclosure. However, the patent protection scope of the present invention should still be subject to the scope defined by the appended claims.

The invention claimed is:

1. A display substrate, comprising:
a substrate and a plurality of sub-pixels, wherein at least one sub-pixel comprises a pixel drive circuit and a light emitting device connected to the pixel drive circuit, the pixel drive circuit comprises a plurality of transistors, at least one transistor comprises an active layer and two gate electrodes; the substrate is provided with a semiconductor layer and a plurality of conductive layers disposed on a side of the semiconductor layer away from the substrate, at least one conductive layer is provided with at least one electrode plate, and there is an overlapping region between an orthographic projection of the electrode plate on the substrate and an orthographic projection of the active layer between the two gate electrodes on the substrate.

2. The display substrate according to claim 1, wherein the plurality of conductive layers comprise a first conductive layer, a second conductive layer, and a third conductive layer disposed sequentially on a side of the semiconductor layer away from the substrate, and the electrode plate is disposed on the first conductive layer, the second conductive layer, or the third conductive layer.

3. The display substrate according to claim 2, wherein the display substrate further comprises a first power supply line connected to the pixel drive circuit, and at least one electrode plate is connected to the first power supply line.

4. The display substrate according to claim 2, wherein the plurality of transistors at least comprise a first transistor, a second transistor, a third transistor, a fourth transistor, and a fifth transistor;
a first electrode of the first transistor is connected to a data signal line, and a second electrode of the first transistor is connected to a third node;
a first electrode of the second transistor is connected to a first node, and a second electrode of the second transistor is connected to a fourth node;
a gate electrode of the third transistor is connected to the first node, a first electrode of the third transistor is connected to a first power supply line, and a second electrode of the third transistor is connected to the fourth node;
a first electrode of the fourth transistor is connected to an initial signal line, and a second electrode of the fourth transistor is connected to the first node; and
a first electrode of the fifth transistor is connected to the first power supply line, and a second electrode of the fifth transistor is connected to a second node.

5. The display substrate according to claim 4, wherein the pixel drive circuit further comprises a storage capacitor and a threshold capacitor, the storage capacitor comprises a first electrode plate and a second electrode plate of the storage capacitor, and the threshold capacitor comprises a first electrode plate and a second electrode plate of the threshold capacitor; the first electrode plate of the storage capacitor is connected to the third node, and the second electrode plate of the storage capacitor is connected to the second node; and the first electrode plate of the threshold capacitor is connected to the first node, and the second electrode plate of the threshold capacitor is connected to the second node.

6. The display substrate according to claim 5, wherein the first electrode plate of the storage capacitor and the first electrode plate of the threshold capacitor are disposed on the first conductive layer, the first electrode plate of the storage capacitor and the first electrode plate of the threshold capacitor are arranged at intervals, and the first electrode plate of the storage capacitor is not overlapped with the semiconductor layer.

7. The display substrate according to claim 5, wherein the second electrode plate of the storage capacitor and the second electrode plate of the threshold capacitor are disposed on the second conductive layer and are connected to each other, there is an overlapping region between an orthographic projection of the second electrode plate of the storage capacitor on the substrate and an orthographic projection of the first electrode plate of the storage capacitor on the substrate, and there is an overlapping region between an orthographic projection of the second electrode plate of the threshold capacitor on the substrate and an orthographic projection of the first electrode plate of the threshold capacitor on the substrate.

8. The display substrate according to claim 4, wherein the fifth transistor is a double-gate transistor, and the fifth transistor at least comprises a fifth active layer and two fifth gate electrodes; the electrode plate comprises a first electrode plate, and there is an overlapping region between an orthographic projection of the first electrode plate on the substrate and an orthographic projection of the fifth active layer located between the two fifth gate electrodes on the substrate.

9. The display substrate according to claim 8, wherein the two fifth gate electrodes are disposed on the first conductive layer, the first electrode plate is disposed on the first conductive layer or the second conductive layer, and the first power supply line is disposed on the third conductive layer, wherein the first power supply line is connected to the first electrode plate through a via hole.

10. The display substrate according to claim 9, wherein the second conductive layer further comprises a first power connection line, the first electrode plate is connected to the first power connection line, and the first power supply line is connected to the first power connection line through a via hole.

11. The display substrate according to claim 4, wherein the second transistor is a double-gate transistor, and the second transistor at least comprises a second active layer and two second gate electrodes; the electrode plate comprises a second electrode plate, and there is an overlapping region between an orthographic projection of the second electrode plate on the substrate and an orthographic projection of the second active layer located between the two second gate electrodes on the substrate.

12. The display substrate according to claim 11, wherein the two second gate electrodes are disposed on the first conductive layer, the second electrode plate is disposed on the first conductive layer or the second conductive layer, the third conductive layer is further provided with a first connection electrode, and the first connection electrode is connected to the second electrode plate through a via hole.

13. The display substrate according to claim 12, wherein the first connection electrode is used as a second electrode of the first transistor and is connected to the first electrode plate of the storage capacitor through a via hole.

14. The display substrate according to claim 12, wherein the fourth transistor is a double-gate transistor, and the fourth transistor at least comprises a fourth active layer and two fourth gate electrodes; and there is an overlapping region between an orthographic projection of the first connection electrode on the first power supply line and an orthographic projection of the fourth active layer located between the two fourth gate electrodes on the first power supply line.

15. The display substrate according to claim 4, wherein the third conductive layer is further provided with a second connection electrode, the second connection electrode is simultaneously used as the first electrode of the second transistor and the second electrode of the fourth transistor, and the second connection electrode is connected to the first electrode plate of the threshold capacitor through a via hole.

16. The display substrate according to claim 4, wherein the third conductive layer is further provided with a third connection electrode, the third connection electrode is used as the first electrode of the fourth transistor and is connected to the initial signal line through a via hole, and there is an overlapping region between an orthographic projection of the third connection electrode on the substrate and an orthographic projection of a fourth active layer between two gate electrodes of the fourth transistor on the substrate.

17. A display apparatus, comprising the display substrate according to claim 1.

18. A preparation method for a display substrate, wherein the display substrate comprises a substrate and a plurality of sub-pixels, at least one sub-pixel comprises a pixel drive circuit and a light emitting device connected to the pixel drive circuit, the pixel drive circuit comprises a plurality of transistors, and at least one transistor comprises an active layer and two gate electrodes; the preparation method comprises:

forming a semiconductor layer on the substrate and a plurality of conductive layers disposed on a side of the semiconductor layer away from the substrate, wherein at least one conductive layer is provided with at least one electrode plate, and there is an overlapping region between an orthographic projection of the electrode plate on the substrate and an orthographic projection of the active layer between the two gate electrodes on the substrate.

19. The preparation method for the display substrate according to claim 18, wherein forming the semiconductor layer on the substrate and the plurality of conductive layers disposed on the side of the semiconductor layer away from the substrate comprises:

forming a semiconductor layer on the substrate; and
sequentially forming a first conductive layer, a second conductive layer, and a third conductive layer on the semiconductor layer, wherein the electrode plate is located on the first conductive layer, the second conductive layer, or the third conductive layer.

20. The preparation method for the display substrate according to claim 19, wherein at least one conductive layer is provided with a first power supply line connected to the pixel drive circuit, and at least one electrode plate is connected to the first power supply line.

* * * * *